United States Patent
Lue et al.

(10) Patent No.: US 12,022,654 B2
(45) Date of Patent: Jun. 25, 2024

(54) MEMORY DEVICE AND METHOD OF MANUFACTURING THE SAME

(71) Applicant: MACRONIX International Co., Ltd., Hsinchu (TW)

(72) Inventors: Hang-Ting Lue, Hsinchu (TW); Guan-Ru Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 287 days.

(21) Appl. No.: 17/185,275

(22) Filed: Feb. 25, 2021

(65) Prior Publication Data

US 2022/0157848 A1 May 19, 2022

Related U.S. Application Data

(60) Provisional application No. 63/114,532, filed on Nov. 17, 2020.

(51) Int. Cl.
*H10B 43/10* (2023.01)
*H10B 43/27* (2023.01)

(52) U.S. Cl.
CPC .......... *H10B 43/27* (2023.02); *H10B 43/10* (2023.02)

(58) Field of Classification Search
CPC ......... H01L 27/11582; H01L 27/11565; H01L 27/11578; H01L 27/11521; H01L 27/11556; H01L 27/11568; H01L 27/11519; H01L 23/53257; H01L 27/1157
See application file for complete search history.

(56) References Cited

U.S. PATENT DOCUMENTS

| | | |
|---|---|---|
| 9,748,264 B1 | 8/2017 | Jiang et al. |
| 9,837,435 B1 | 12/2017 | Chang et al. |
| 10,727,243 B1 | 7/2020 | Lue et al. |
| 2003/0022500 A1 | 1/2003 | Tang |
| 2005/0199945 A1 | 9/2005 | Kodama et al. |
| 2010/0244119 A1 | 9/2010 | Fukuzumi et al. |
| 2010/0265773 A1 | 10/2010 | Lung et al. |
| 2011/0298013 A1 | 12/2011 | Hwang et al. |
| 2012/0182801 A1 | 7/2012 | Lue |
| 2012/0182807 A1 | 7/2012 | Lue |
| 2012/0231613 A1 | 9/2012 | Lung et al. |
| 2015/0318301 A1 | 11/2015 | Lee et al. |

(Continued)

OTHER PUBLICATIONS

"Office Action of Taiwan Counterpart Application", dated Jul. 16, 2021, pp. 1-5.

(Continued)

*Primary Examiner* — Brian Turner
*Assistant Examiner* — Zhijun Xu
(74) *Attorney, Agent, or Firm* — J.C. PATENTS

(57) ABSTRACT

Provided is a memory device including a substrate, a stack structure, a polysilicon layer, a vertical channel structure, and a charge storage structure. The stack structure is disposed on the substrate. The stack structure includes a plurality of dielectric layers and a plurality of conductive layers stacked alternately. The polysilicon layer is disposed between the substrate and the stack structure. The vertical channel structure penetrates through the stack structure and the polysilicon layer. The charge storage structure is at least disposed between the vertical channel structure and the plurality of conductive layers.

20 Claims, 24 Drawing Sheets

(56) References Cited

U.S. PATENT DOCUMENTS

| | | | |
|---|---|---|---|
| 2015/0357346 A1* | 12/2015 | Jang | H01L 29/045 |
| | | | 257/329 |
| 2017/0110470 A1* | 4/2017 | Rabkin | H10B 41/27 |
| 2017/0287928 A1* | 10/2017 | Kanamori | H01L 23/528 |
| 2018/0308856 A1* | 10/2018 | Cho | H01L 23/5226 |
| 2019/0148393 A1 | 5/2019 | Lue | |
| 2019/0244971 A1* | 8/2019 | Harari | H01L 23/53257 |
| 2020/0006375 A1* | 1/2020 | Zhou | H01L 27/11578 |
| 2020/0013791 A1* | 1/2020 | Or-Bach | H01L 29/40114 |
| 2020/0203362 A1* | 6/2020 | Rabkin | H10B 43/27 |
| 2020/0266212 A1* | 8/2020 | Baek | H01L 21/76895 |
| 2020/0381450 A1* | 12/2020 | Lue | H01L 29/792 |
| 2021/0375900 A1* | 12/2021 | Zhang | H01L 27/11582 |
| 2021/0375919 A1 | 12/2021 | Wang et al. | |
| 2021/0408047 A1* | 12/2021 | Wang | H10B 51/20 |

OTHER PUBLICATIONS

"Search Report of Europe Counterpart Application", dated Oct. 6, 2021, p. 1-p. 8.

* cited by examiner

MEMORY DEVICE AND METHOD OF MANUFACTURING THE SAME

CROSS-REFERENCE TO RELATED APPLICATION

This application claims the priority benefit of U.S. provisional application Ser. No. 63/114,532, filed on Nov. 17, 2020. The entirety of the above-mentioned patent application is hereby incorporated by reference herein and made a part of this specification.

BACKGROUND OF THE INVENTION

Field of the Invention

The present invention relates to a semiconductor device and a method of manufacturing the same, and more particularly to a memory device and a method of manufacturing the same.

Description of Related Art

A non-volatile memory (such as a flash memory) is a memory widely used in personal computers and other electronic devices because it has an advantage that the stored data does not disappear after being powered off.

The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY OF THE INVENTION

The invention provides a memory device including a substrate, a stack structure, a polysilicon layer, a vertical channel structure, and a charge storage structure. The stack structure is disposed on the substrate. The stack structure includes a plurality of dielectric layers and a plurality of conductive layers stacked alternately. The polysilicon layer is disposed between the substrate and the stack structure. The vertical channel structure penetrates through the stack structure and the polysilicon layer. The charge storage structure is at least disposed between the vertical channel structure and the plurality of conductive layers.

In one embodiment of the invention, the polysilicon layer includes a doped polysilicon material, and the doped polysilicon material is a P-type doped polysilicon material.

In one embodiment of the invention, the vertical channel structure includes: two source/drain (S/D) pillars, penetrating through the stack structure and the polysilicon layer, and partially extending into the substrate; an insulating pillar, disposed between the two S/D pillars to separate the two S/D pillars; and a channel layer, surrounding the two S/D pillars.

In one embodiment of the invention, one of the two S/D pillars includes: a first portion, embedded in the substrate; and a second portion, disposed on the first portion, wherein a cross-sectional area of the first portion is less than a cross-sectional area of the second portion, the first and second portions have a same doped polysilicon material, and the doped polysilicon material is a N-type doped polysilicon material.

In one embodiment of the invention, the channel layer protrudes downward from a bottom surface of the polysilicon layer, and a distance between a bottom surface of the channel layer and the bottom surface of the polysilicon layer is less than 200 Å.

In one embodiment of the invention, the charge storage structure surrounds each conductive layer in the stack structure, the channel layer protrudes upward from a top surface of a topmost conductive layer, and a distance between a top surface of the channel layer and a top surface of a corresponding charge storage structure surrounding the topmost conductive layer is less than 200 Å.

In one embodiment of the invention, the charge storage structure continuously extends between the channel layer and the stack structure, the channel layer protrudes upward from a top surface of a topmost conductive layer, and a distance between a top surface of the channel layer and a top surface of the topmost conductive layer is less than 200 Å.

In one embodiment of the invention, the channel layer includes: a main body portion, disposed between the two S/D pillars and the stack structure, and disposed the two S/D pillars and the polysilicon layer; and an extending portion, connecting a bottom surface of the main body portion, and partially extending into the two S/D pillars.

In one embodiment of the invention, the memory device further includes a gate dielectric layer disposed between the polysilicon layer and the channel layer.

In one embodiment of the invention, the plurality of conductive layers of the stack structure and the polysilicon layer have different materials.

The invention provides a method of manufacturing a memory device including: forming an etching stop layer on a substrate; forming a stack structure on the etching stop layer, wherein the stack structure includes a plurality of dielectric layers and a plurality of conductive layers stacked alternately; and forming a vertical channel structure penetrating through the stack structure and the etching stop layer.

In one embodiment of the invention, the etching stop layer includes a doped polysilicon material, and the doped polysilicon material is a P-type doped polysilicon material.

In one embodiment of the invention, before forming the etching stop layer on the substrate, the method further includes forming two polysilicon layers in the substrate.

In one embodiment of the invention, the vertical channel structure includes: two source/drain (S/D) pillars, penetrating through the stack structure and the etching stop layer, and partially extending into the substrate; an insulating pillar, disposed between the two S/D pillars to separate the two S/D pillars; and a channel layer, surrounding the two S/D pillars.

In one embodiment of the invention, one of the two S/D pillars includes: forming a first portion, embedded in the substrate; and a second portion, disposed on the first portion, wherein a cross-sectional area of the first portion is less than a cross-sectional area of the second portion, the first and second portions have a same doped polysilicon material, and the doped polysilicon material is a N-type doped polysilicon material.

In one embodiment of the invention, the channel layer protrudes upward from a top surface of a topmost conductive layer, and a distance between the top surface of the channel layer and the top surface of the topmost conductive layer is less than 200 Å.

In one embodiment of the invention, after the forming the two third openings, the channel layer protrudes downward from a bottom surface of the etching stop layer, and a distance between a bottom surface of the channel layer and the bottom surface of the etching stop layer is less than 200 Å.

In one embodiment of the invention, the plurality of conductive layers of the stack structure and the etching stop layer have different materials.

In one embodiment of the invention, the method further includes forming a charge storage layer between the stack structure and the channel layer.

In one embodiment of the invention, before the forming the plurality of conductive layers, the method further includes forming a charge storage layer to surround the plurality of conductive layers.

Based on the above, in the present embodiment, the P-type polysilicon layer is formed between the substrate and the stacked structure, so that the P-type polysilicon layer is used as an etching stop layer for subsequent vertical channel holes, thereby avoiding over-etching. In addition, in the present embodiment, two N-type polysilicon layers are formed in the substrate, so that the two N-type polysilicon layers are used as etching stop layers for subsequent source/drain openings, thereby avoiding over-etching.

Further, in the present embodiment, the channel layer protrudes upward from the top surface of the charge storage layer by a distance of less than 200 Å, and the channel layer protrudes downward from the bottom surface of the P-type polysilicon layer by a distance of less than 200 Å, so as to effectively reduce unnecessary parasitic leakage current, thereby increasing the operation window of the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
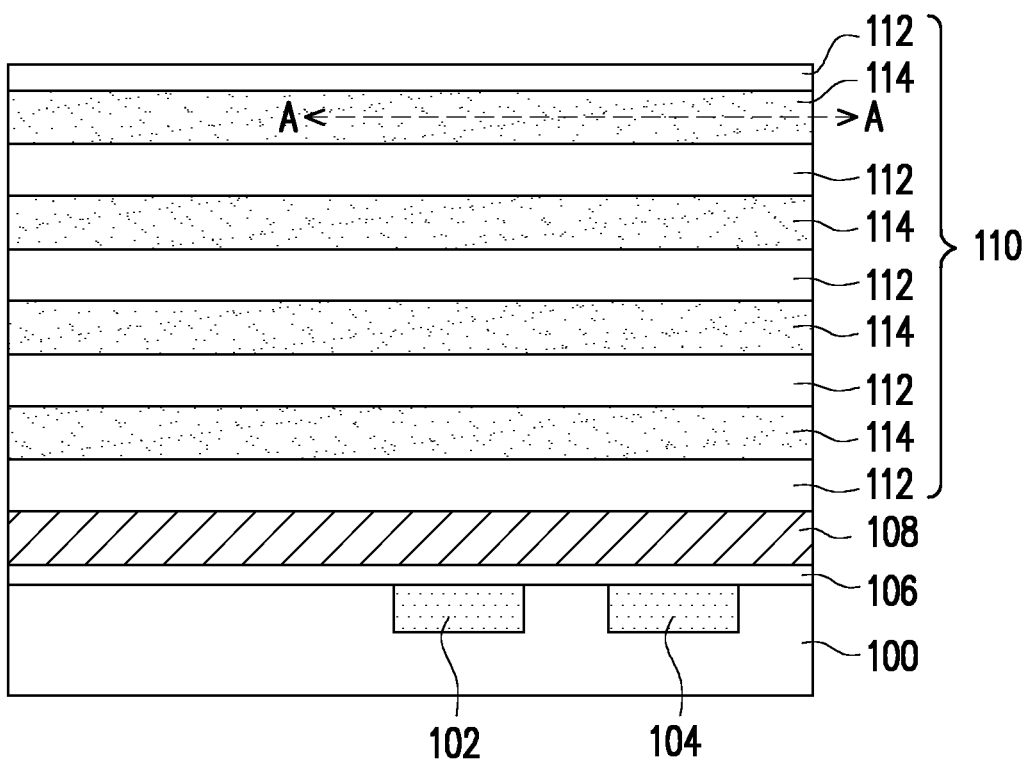
FIG. 1A to FIG. 1R are schematic cross-sectional views illustrating a manufacturing process of a memory device according to a first embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1B:
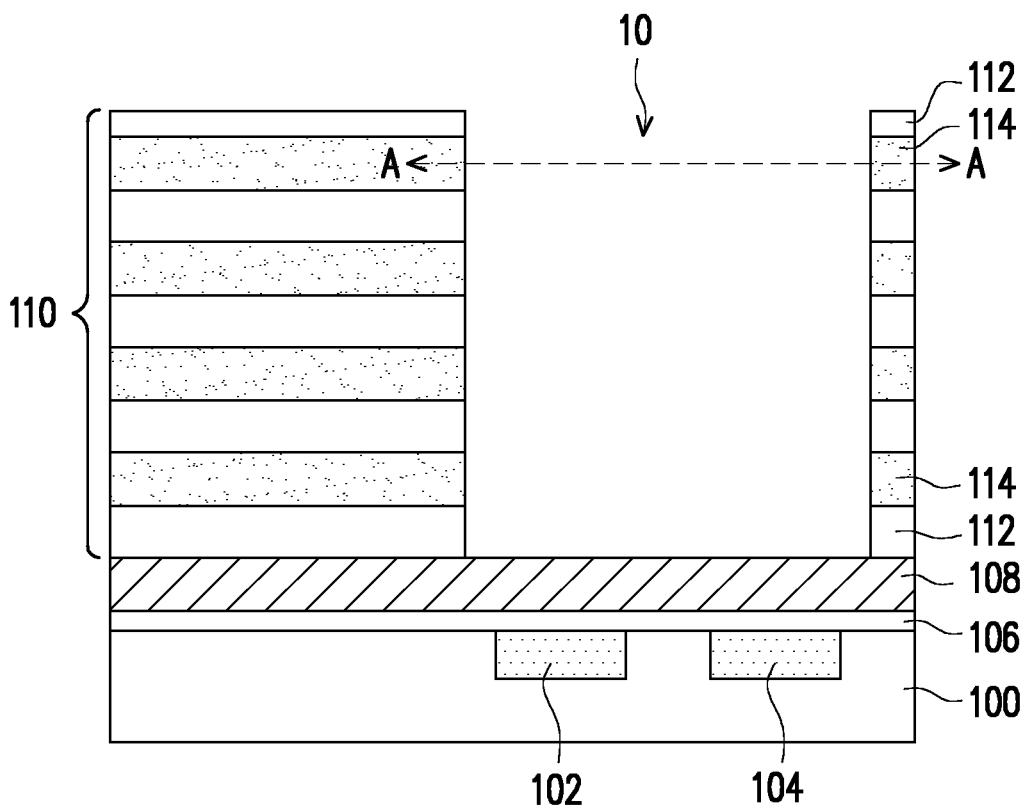
Figure 1C:
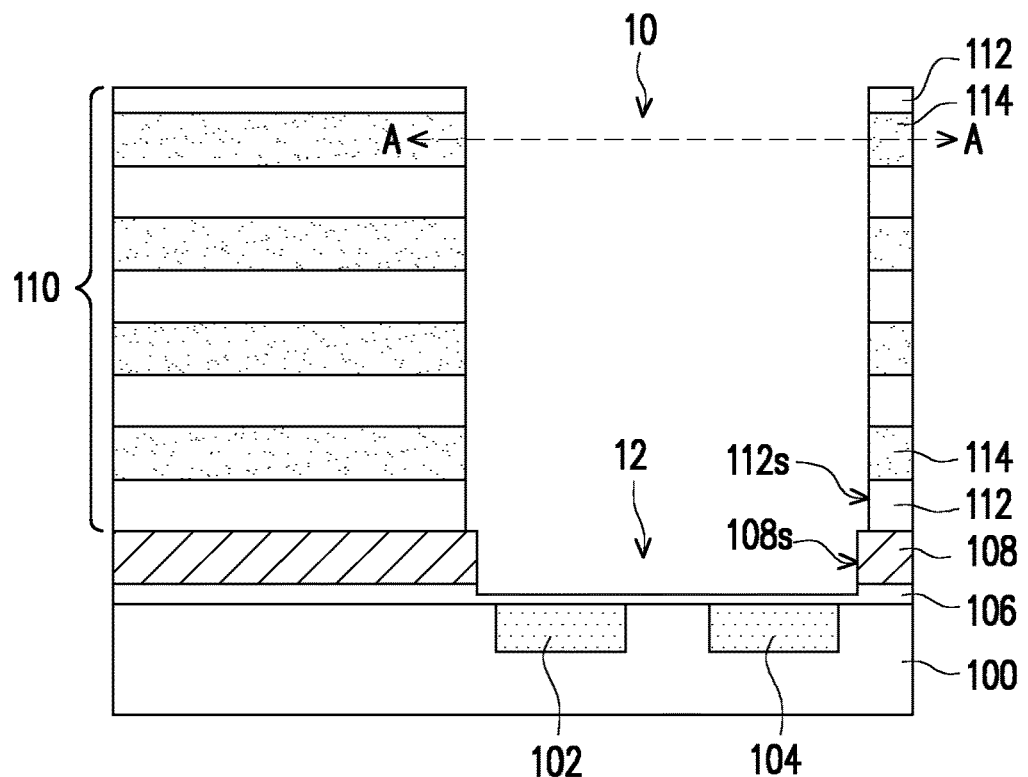
Figure 1D:
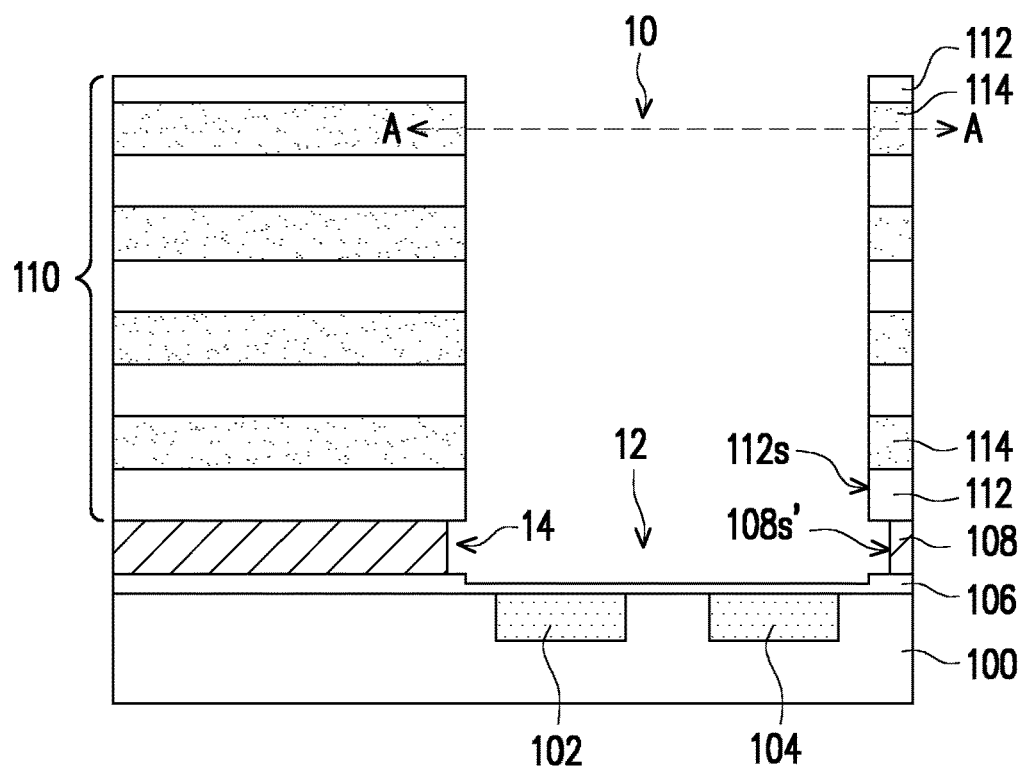
Figure 1E:
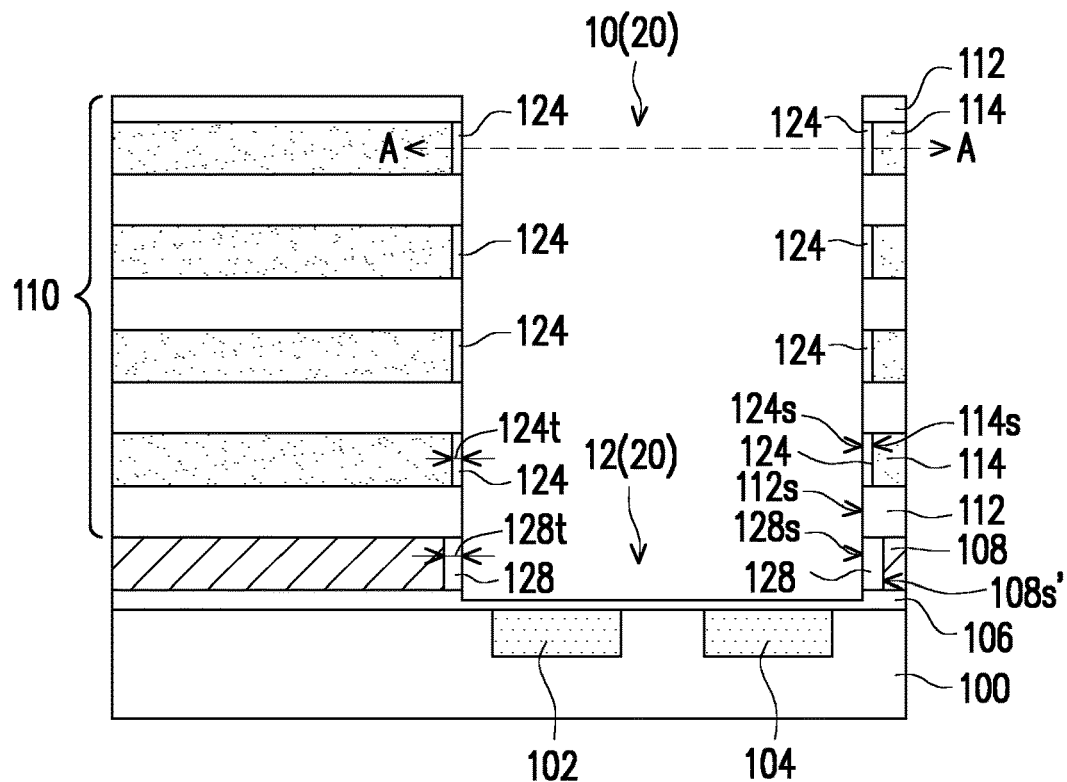
Figure 1F:
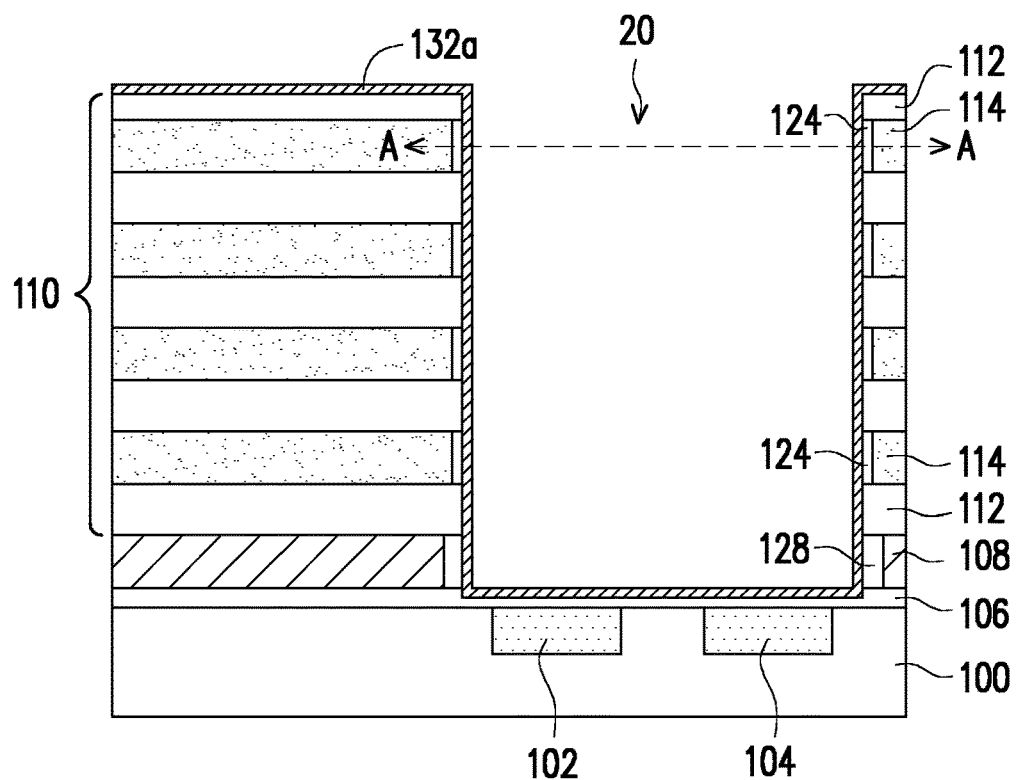
Figure 1G:
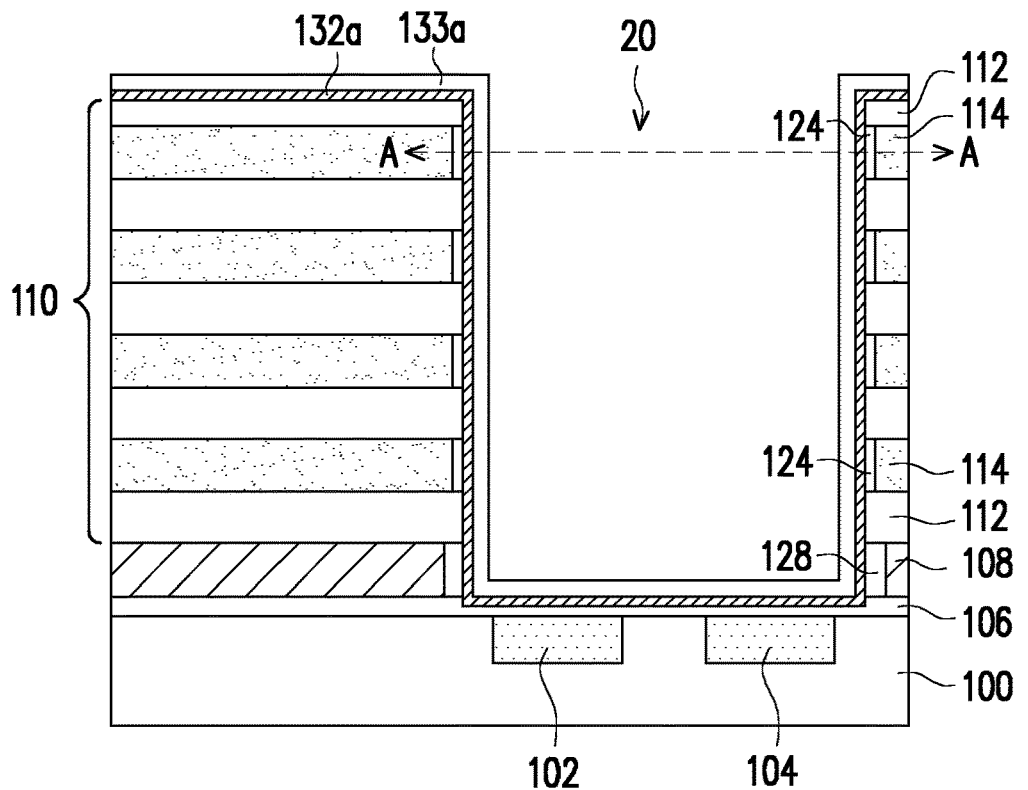
Figure 1H:
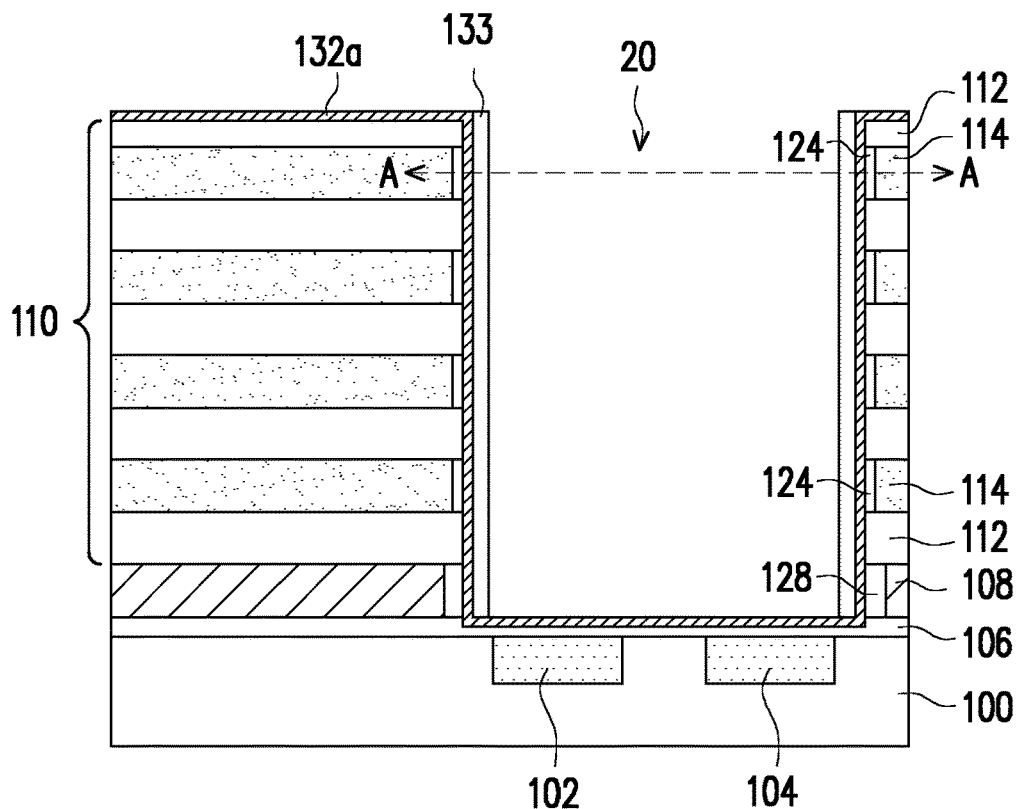
Figure 1I:
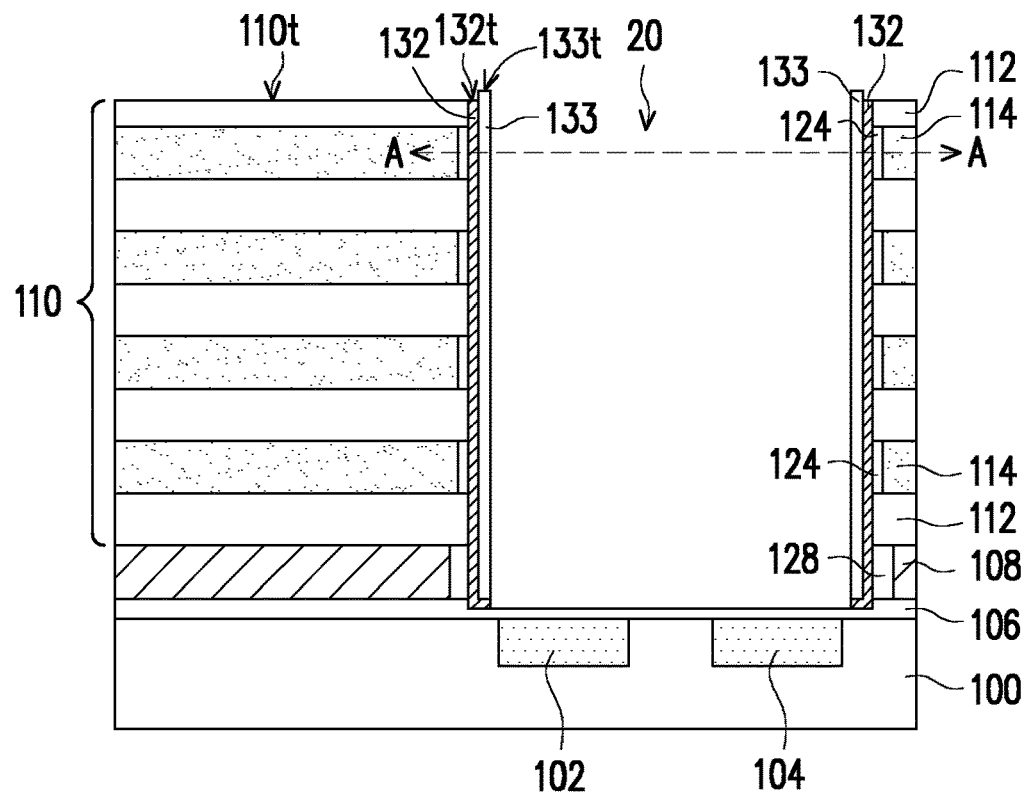
Figure 1J:
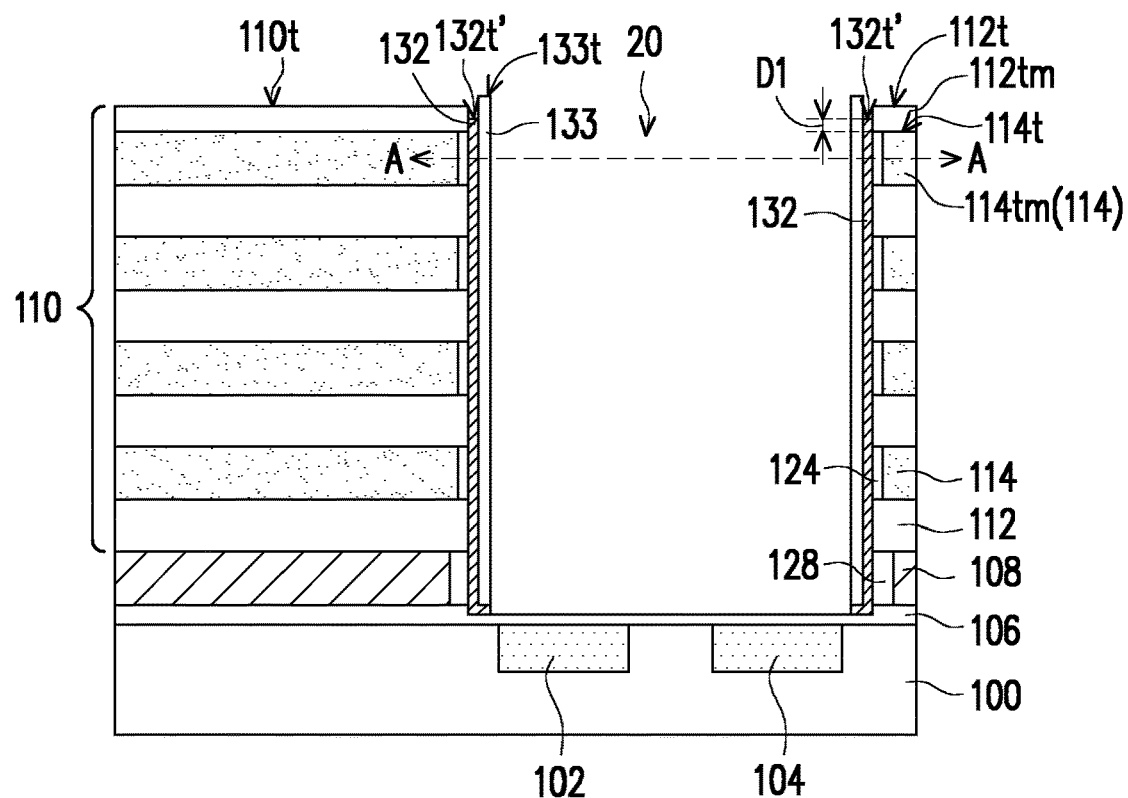
Figure 1K:
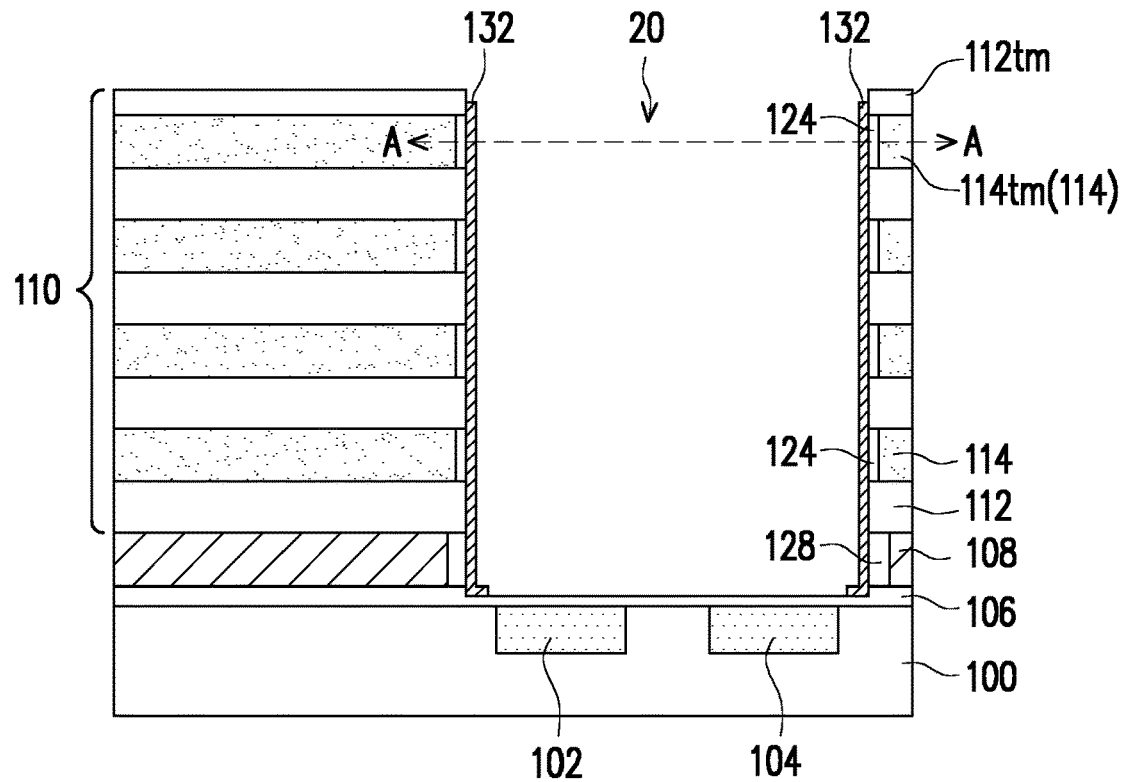
Figure 1L:
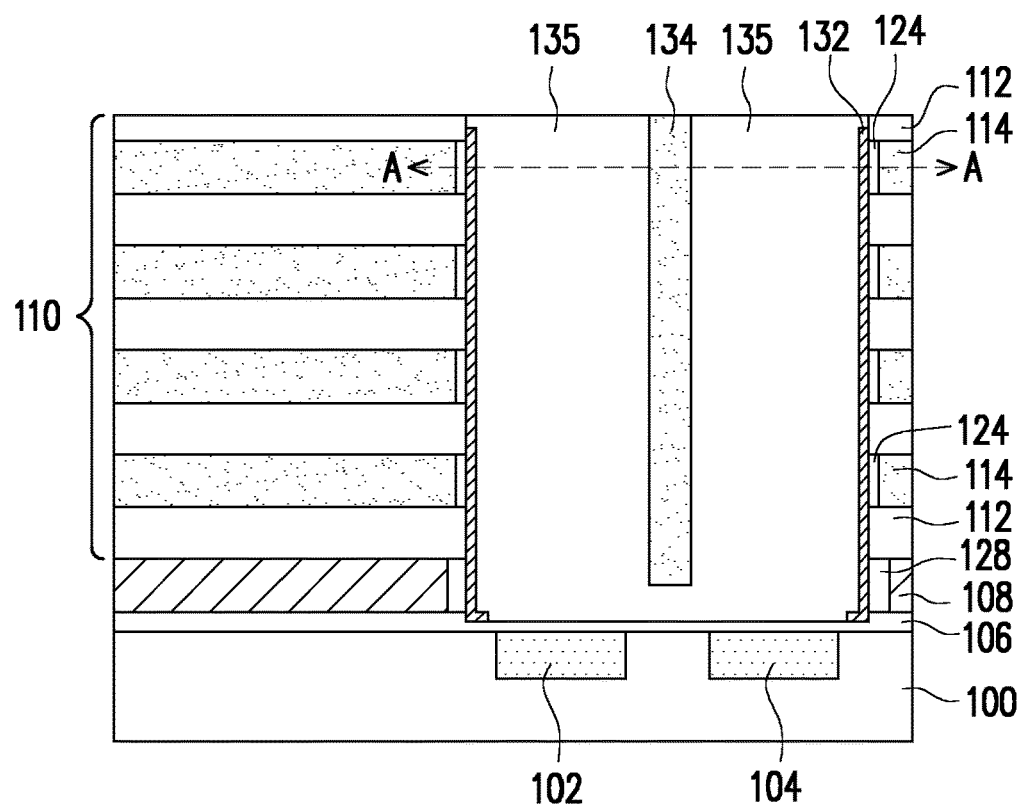
Figure 1M:
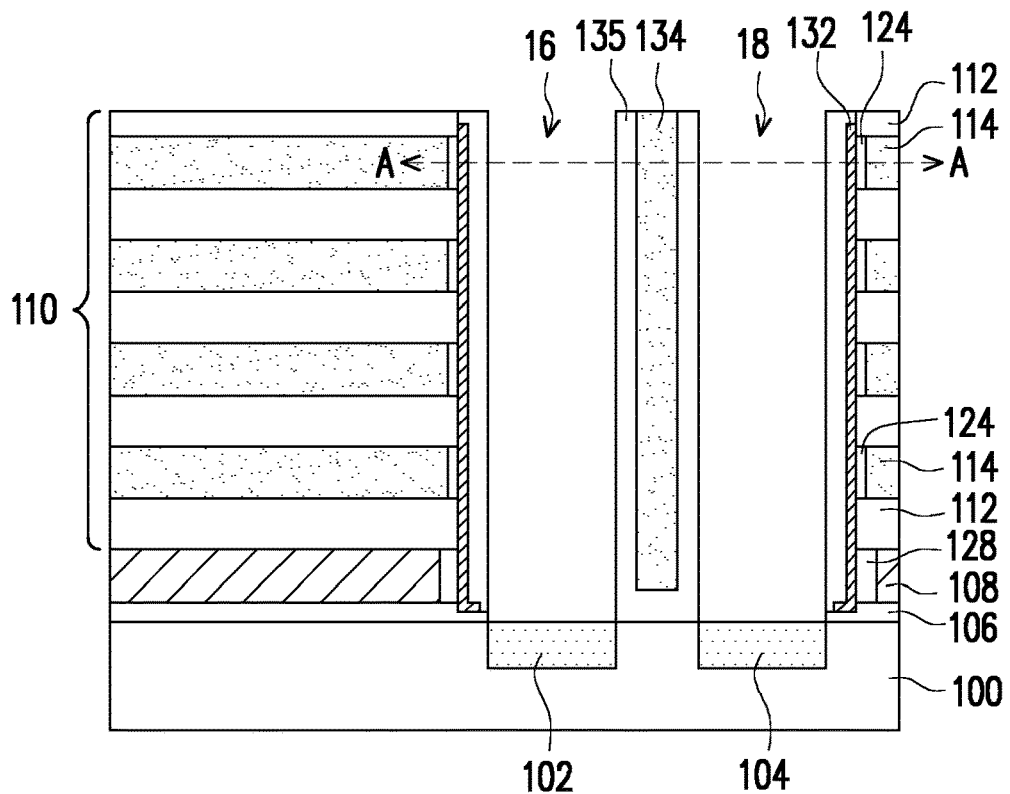
Figure 1N:
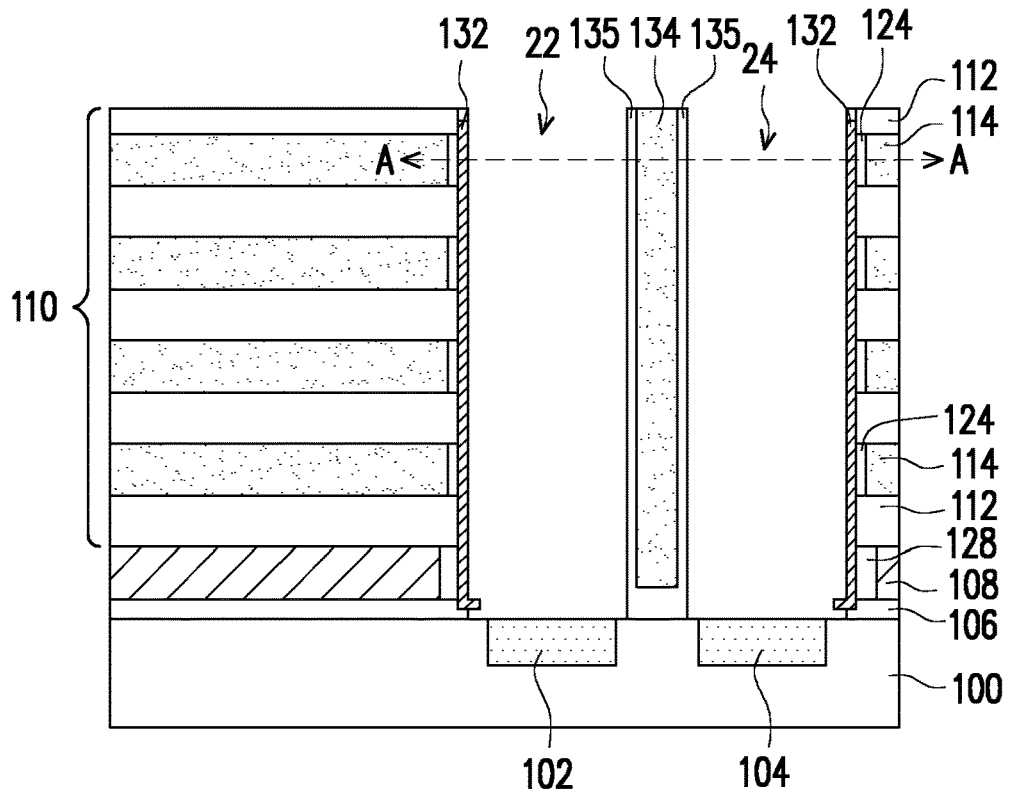
Figure 10:
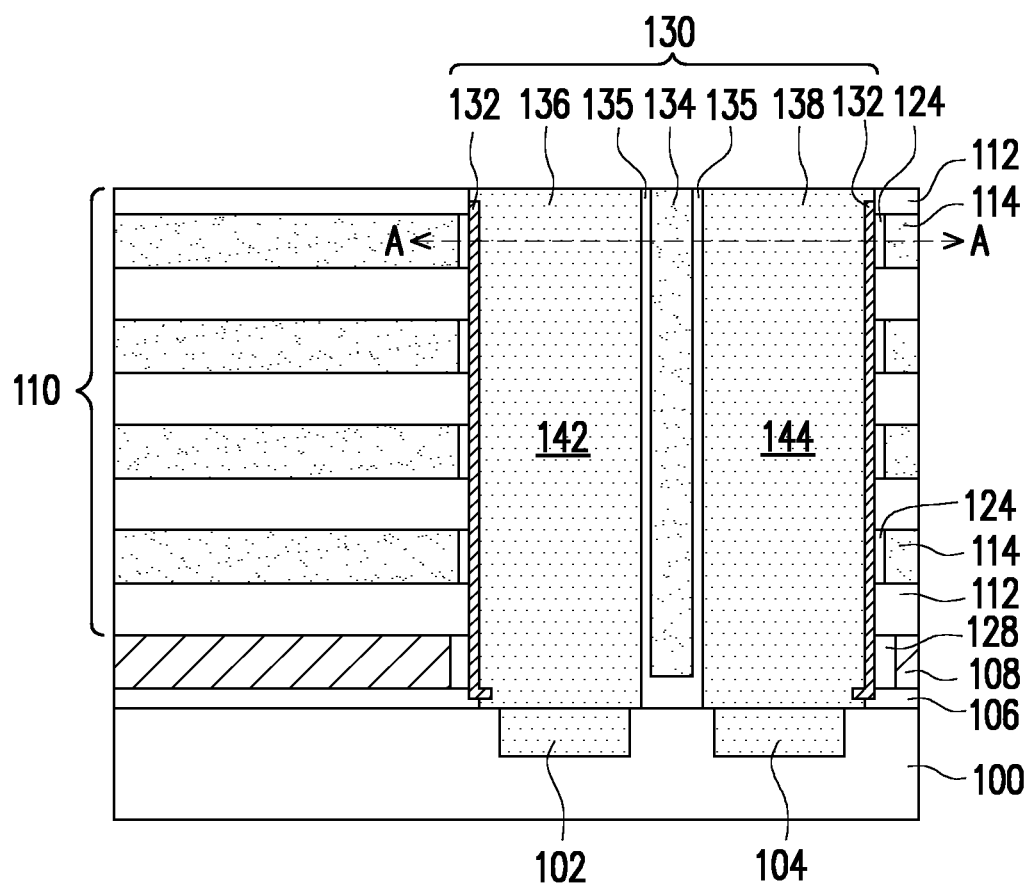
Figure 1P:
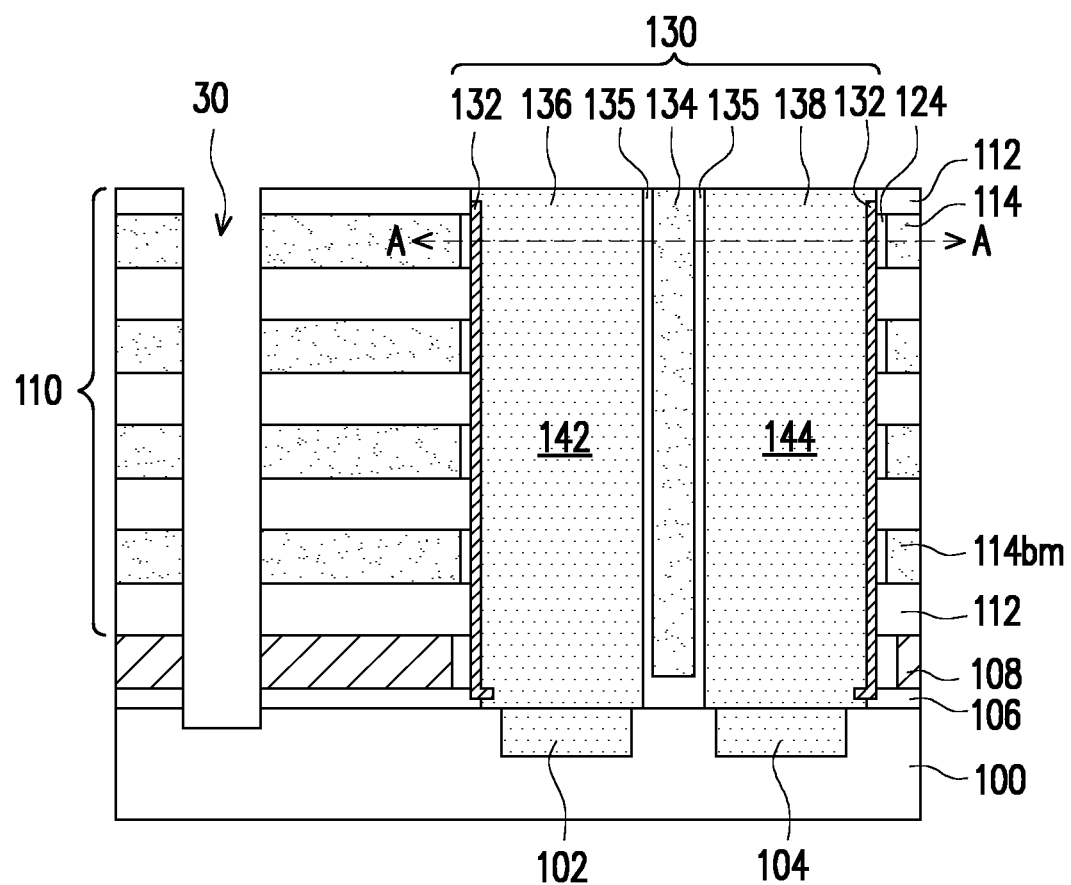
Figure 1Q:
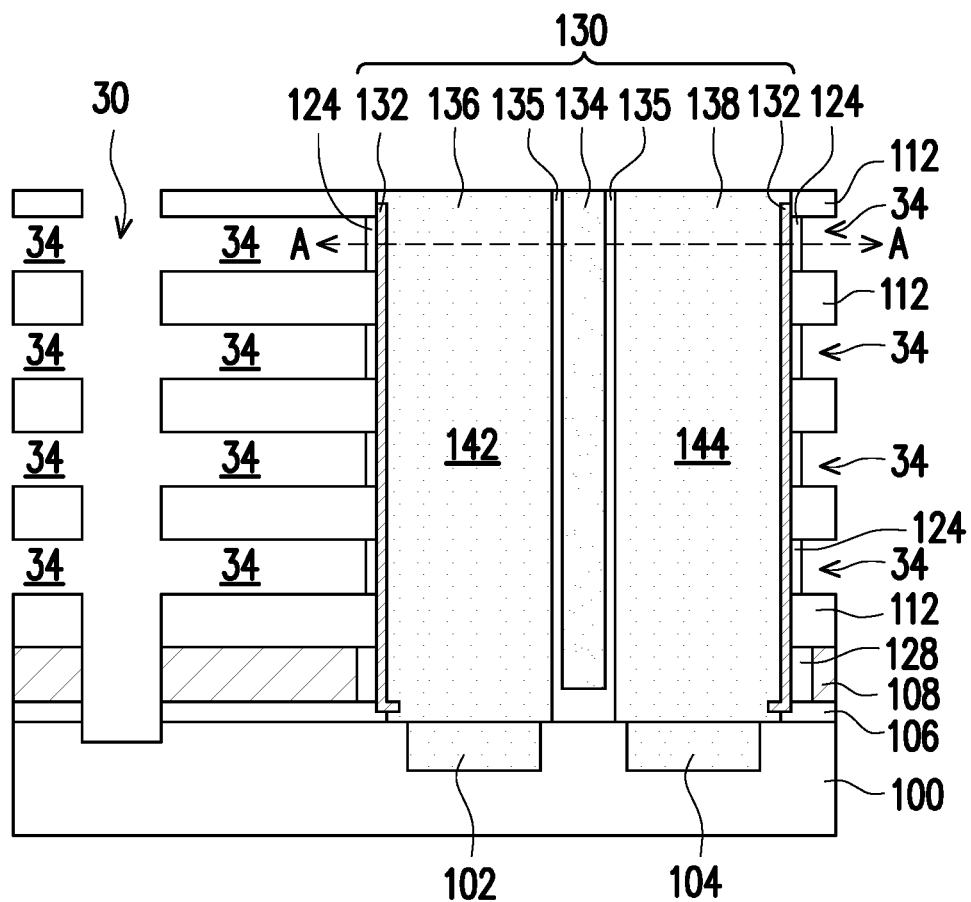
Figure 1R:
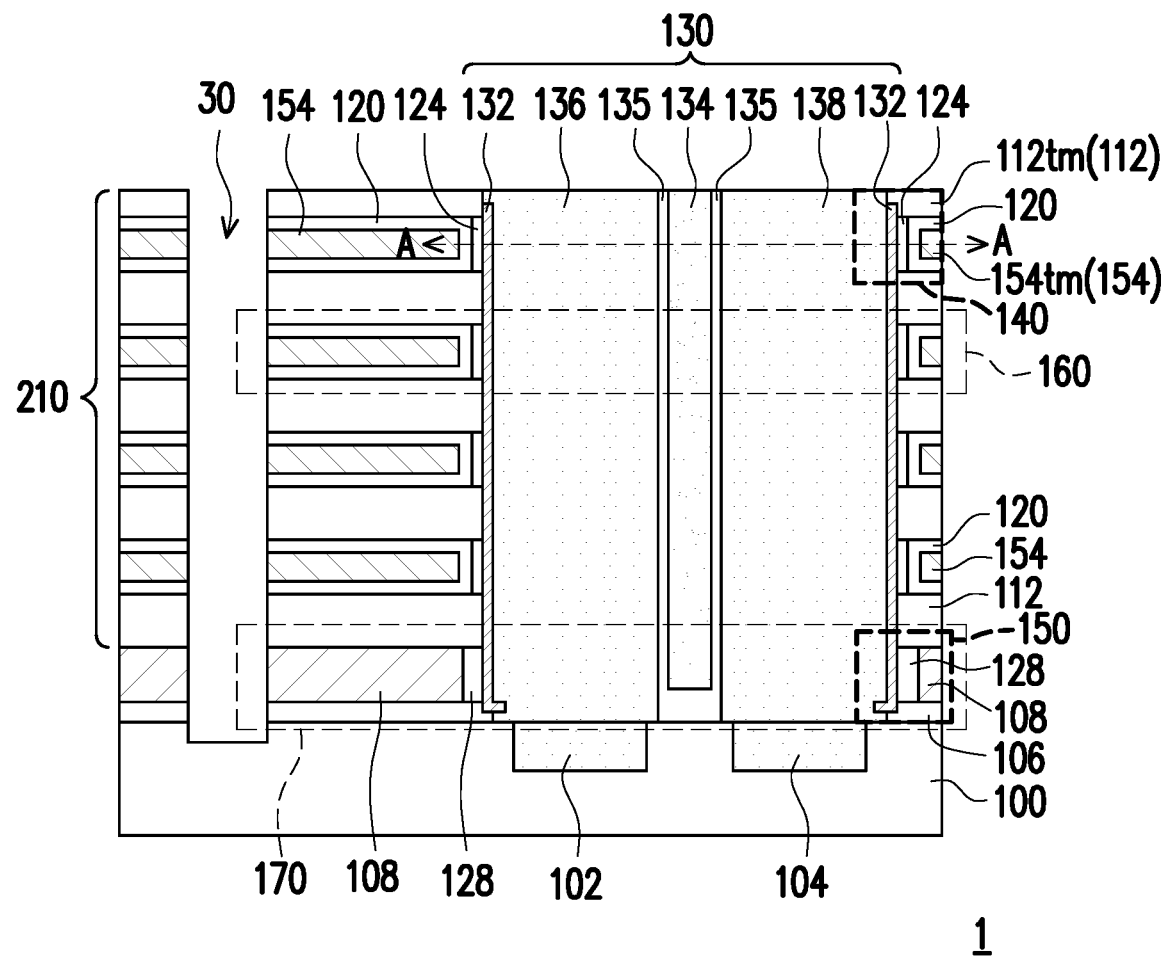
Figure 2A:
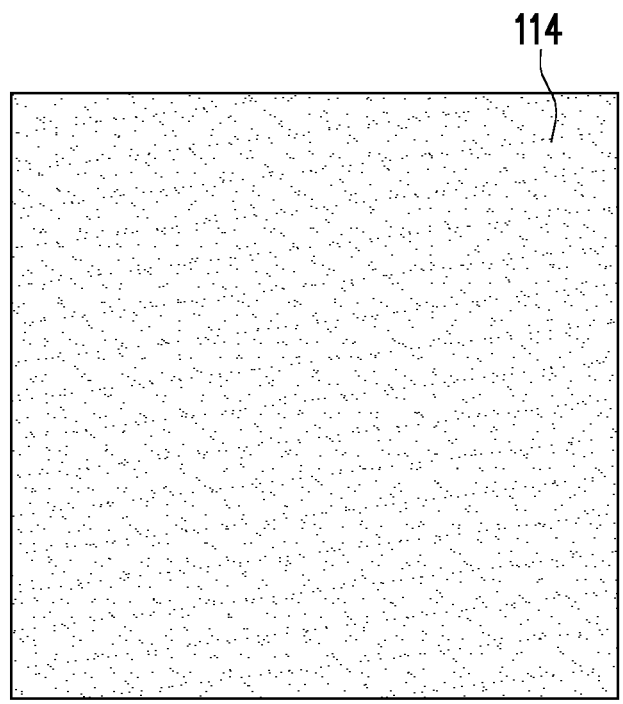
FIG. 2A to FIG. 2R are schematic plan views along a line A-A of FIG. 1A to FIG. 1R, respectively.

FIG. 1A to FIG. 1R are schematic cross-sectional views illustrating a manufacturing process of a memory device 1 according to a first embodiment of the invention. FIG. 2A to FIG. 2R are schematic plan views along a line A-A of FIG. 1A to FIG. 1R, respectively. The following embodiment is illustrated by using the three-dimensional flash memory as an AND flash memory as an example, but the invention is not limited thereto.

Referring to FIG. 1A and FIG. 2A, first, a substrate 100 is provided. In an embodiment, the substrate 100 includes a dielectric substrate. The dielectric substrate may be a dielectric layer formed on a silicon substrate, such as a silicon oxide layer.

Next, polysilicon layers 102 and 104 are formed in the substrate 100. In an embodiment, a method for forming the polysilicon layers 102 and 104 may include: forming openings in the substrate 100; forming a polysilicon material in the openings; and performing a planarization process on the polysilicon material. In an embodiment, the polysilicon layers 102 and 104 may have the same material, such as a doped polysilicon material. For example, the polysilicon layers 102 and 104 may be N-type doped (N+) polysilicon layers.

Thereafter, a cap layer 106 and a polysilicon layer 108 are sequentially formed on the substrate 100. In one embodiment, a material of the cap layer 106 includes a dielectric material, such as silicon oxide. In an embodiment, a material of the polysilicon layer 108 includes a doped polysilicon material. For example, the polysilicon layer 108 may be a P-type doped (P+) polysilicon layer. In alternative embodiments, the polysilicon layer 108 includes a high work function material, such as a material of a work function greater than 4 eV. In other embodiments, the polysilicon layer 108 may be a material of a work function greater than 4.5 eV. In other embodiments, the polysilicon layer 108 and the polysilicon layers 102 and 104 may have different conductivity types.

Then, a stack structure 110 is formed on the polysilicon layer 108, so that the cap layer 106 and the polysilicon layer 108 are disposed between the substrate 100 and the stack structure 110. Specifically, the stack structure 110 includes a plurality of dielectric layers 112 and a plurality of sacrificial layers 114 stacked alternately. In an embodiment, the dielectric layers 112 and the sacrificial layers 114 may be different dielectric materials. For example, the dielectric layers 112 may be silicon oxide layers; and the sacrificial layers 114 may be silicon nitride layers. In an embodiment, the number of the dielectric layers 112 and the sacrificial layers 114 may be 8 layers, 16 layers, 32 layers, 64 layers or more layers.

Figure 2B:
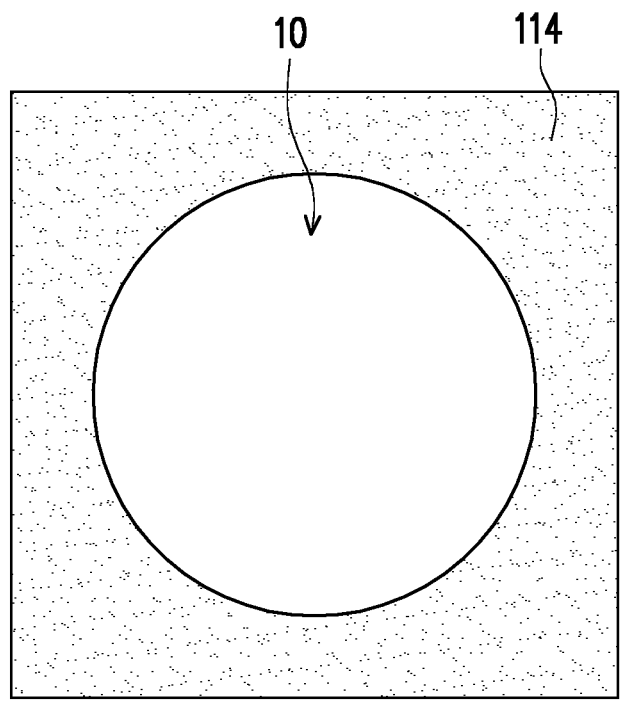

Referring to FIG. 1B and FIG. 2B, an opening 10 (also referred to as a first opening) is formed in the stack structure 110. As shown in FIG. 1B, the opening 10 penetrates through the stack structure 110 and exposes the polysilicon layer 108. In such embodiment, the polysilicon layer 108 may be regarded as an etching stop layer for forming the opening 10, so as to avoid over-etching. In this case, the opening 10 may be regarded as a vertical channel hole. In one embodiment, the opening 10 has a circular profile from the plan view of FIG. 2B, but the present invention is not limited thereto. In other embodiments, the opening 10 may have profiles of other shapes, such as an ellipse, a rectangle, a polygon, or a combination thereof.

Figure 2C:
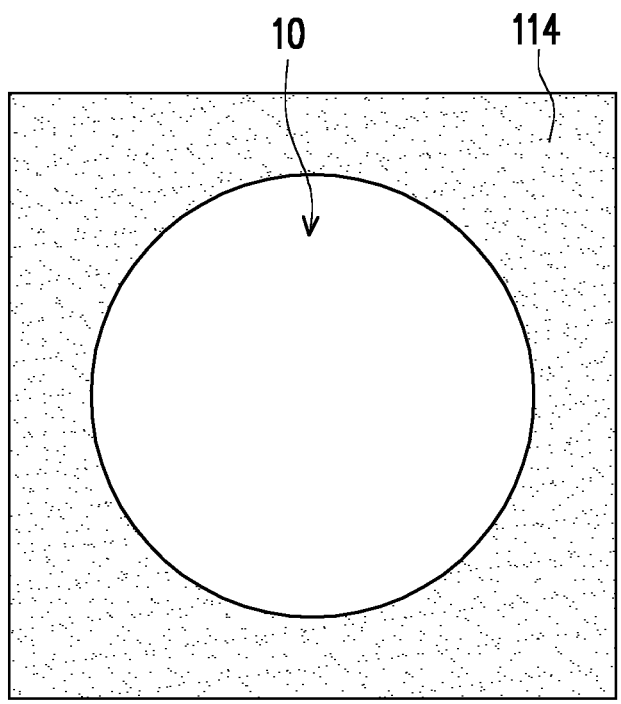

Referring to FIG. 1C and FIG. 2C, the opening 10 is extended downward to form an opening 12 (also referred to as a second opening) penetrating through the polysilicon layer 108. In such embodiment, the cap layer 106 may be regarded as an etching stop layer for forming the opening 12, so as to avoid over-etching. In detail, as shown in FIG. 1C, the opening 12 may be also partially extended into the cap layer 106. In one embodiment, the opening 12 is in spatial communication with the opening 10, and a width of the opening 12 is less than or equal to a width of the opening 10. In other words, a sidewall 108s of the polysilicon layer 108 may protrude from a sidewall 112s of the dielectric layers 112.

Figure 2D:
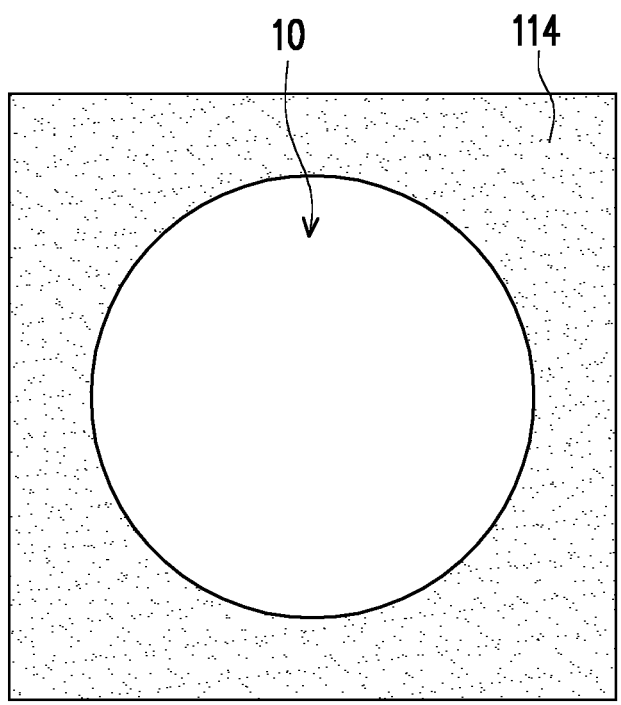

Referring to FIG. 1D and FIG. 2D, a dry etching process is performed on the polysilicon layer 108 to laterally recess the polysilicon layer 108, so that the sidewall 108s' of the polysilicon layer 108 is recessed or concave from the sidewall 112s of the dielectric layers 112. In this case, as shown in FIG. 1D, a recess 14 may be formed between the cap layer 106, the stack structure 110, and the polysilicon layer 108. In one embodiment, the above-mentioned dry etching process includes a chemical dry etching (CDE) process. The above-mentioned chemical dry etching process includes using an etching gas with high etching selectivity to the polysilicon layer 108. That is to say, in the above-mentioned dry etching process, the polysilicon layer 108 exposed by the opening 12 is removed, but the cap layer 106, the dielectric layers 112, and the sacrificial layers 114 are not removed or only a small amount of those are removed. To a certain extent, the above-mentioned dry etching process can avoid the protrusion of the polysilicon layer 108 and may form a smoother profile to facilitate the subsequent deposition process.

Figure 2E:
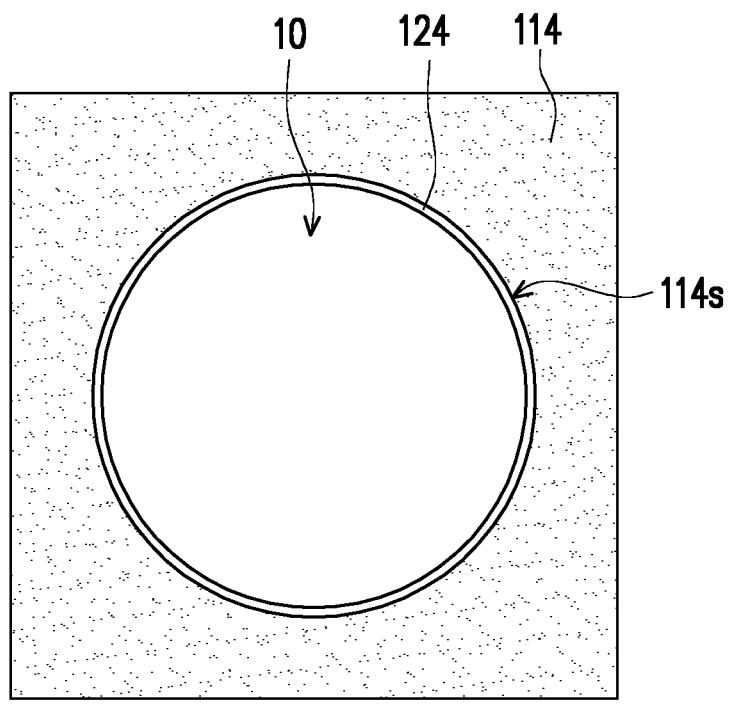

Referring to FIG. 1E and FIG. 2E, an oxidation treatment is performed to form an oxide layer 124 (also referred to as a first oxide layer) on a sidewall 114s of the sacrificial layers 114 exposed by the opening 10, and form an oxide layer 128 (also referred to as a second oxide layer) on the sidewall 108s' of the polysilicon layer 108 exposed by the opening 12. In one embodiment, the oxide layer 124 and the oxide layer 128 have different materials. For example, the oxide layer 124 may be a silicon oxynitride layer, and the oxide layer 128 may be a silicon oxide layer. In one embodiment, the oxidation treatment includes thermal oxidation, wet oxidation, or a combination thereof. It should be noted that since an oxidation rate of the polysilicon layer 108 is faster than or greater than an oxidation rate of the sacrificial layers 114, a thickness 128t of the oxide layer 128 may be greater than a thickness 124t of the oxide layer 124. As shown in FIG. 1E, the oxide layer 128 may fill up the recess 14, so that the sidewall 128s of the oxide layer 128, the sidewall 112s of the dielectric layers 112, and the sidewall 124s of the oxide layer 124 are substantially coplanar. In other words, a width of the opening 12 may be substantially equal to a width of the opening 10, hereinafter called a combination of the openings 10 and 12 as a composite opening 20. However, the present invention is not limited thereto, in other embodiments, the sidewall 128s of the oxide layer 128, the sidewall 112s of the dielectric layers 112, and the sidewall 124s of the oxide layer 124 may have a slight difference.

Figure 3:
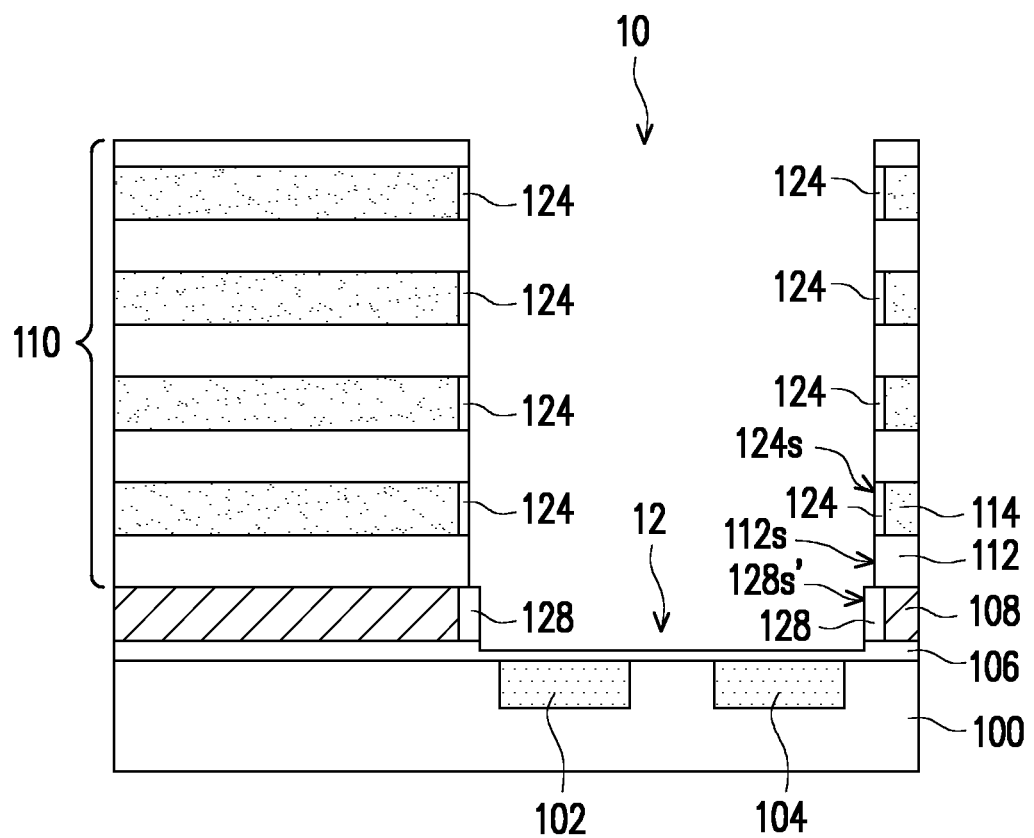
FIG. 3 is a schematic cross-sectional view of a memory device according to an alternative embodiment of the invention.

In alternative embodiments, the above-mentioned dry etching process may not be performed optionally. In other words, the polysilicon layer 108 is not laterally recessed. In this case, after the oxidation treatment, the sidewall 128s' of the oxide layer 128 may protrude from the sidewall 112s of the dielectric layers 112 and the sidewall 124s of the oxide layer 124, as shown in FIG. 3. In such embodiment, the oxide layer 128 may extend into the subsequent formed vertical channel structure 130 (as shown in FIG. 1O).

Figure 2F:
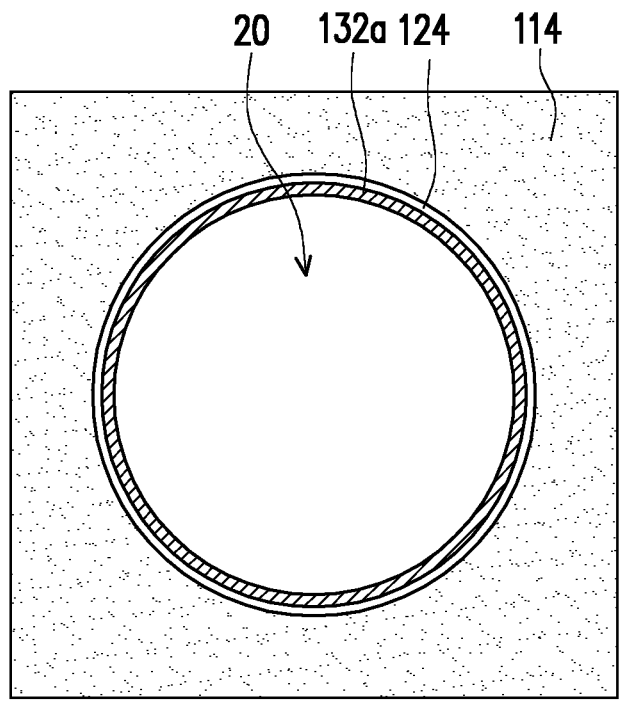

Referring to FIG. 1F and FIG. 2F, a channel material 132a is formed on the substrate 100. Specifically, as shown in FIG. 1F, the channel material 132a conformally covers the top surface of the stack structure 110 and the surface of the composite opening 20. In one embodiment, the channel material 132a includes an undoped polysilicon material or intrinsic polysilicon material, and may be formed by a chemical vapor deposition (CVD).

Figure 2G:
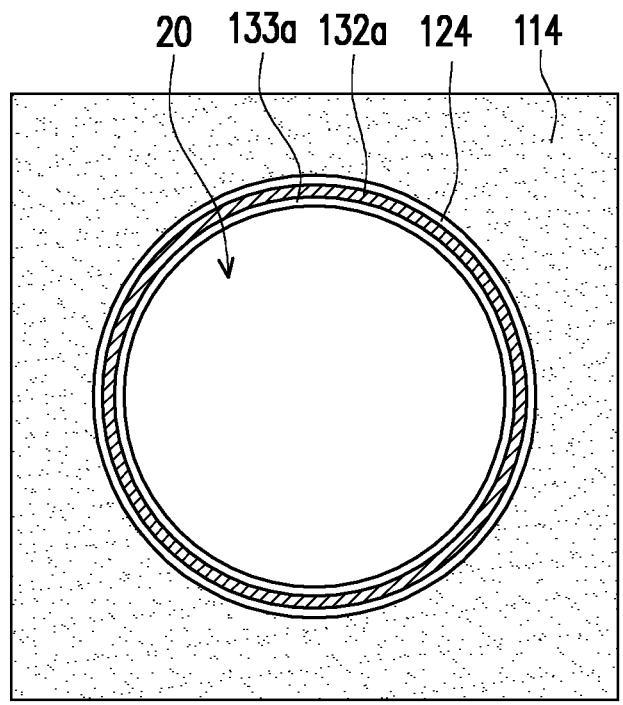

Referring to FIG. 1G and FIG. 2G, a spacer material 133a is formed on the channel material 132a. In an embodiment, the spacer material 133a includes a low temperature oxide (LTO), and may be formed by a low temperature oxide deposition.

Figure 2H:
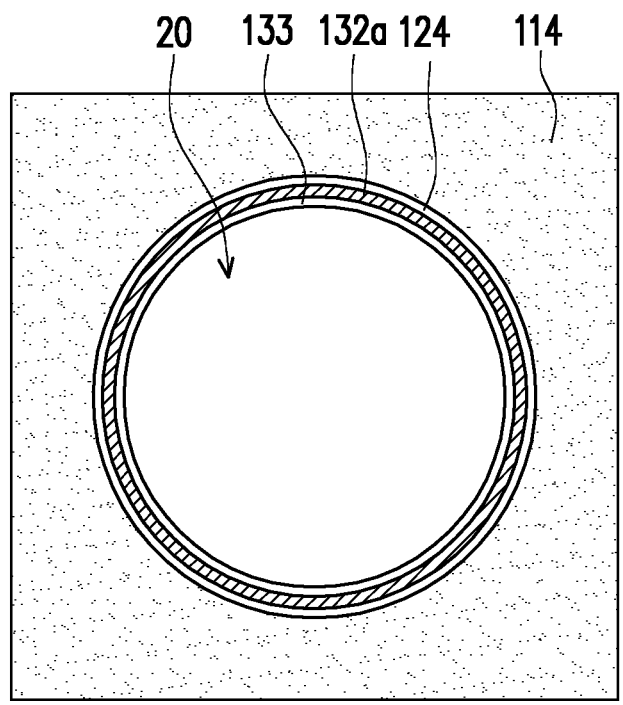

Referring to FIG. 1H and FIG. 2H, a first anisotropic etching process is performed to remove the spacer material 133a on the top surface of the stack structure 110 and the bottom surface of the composite opening 20, thereby forming a spacer 133 on the sidewall of the composite opening 20. In one embodiment, the said first anisotropic etching process includes a reactive ion etching (RIE) process.

Figure 2I:
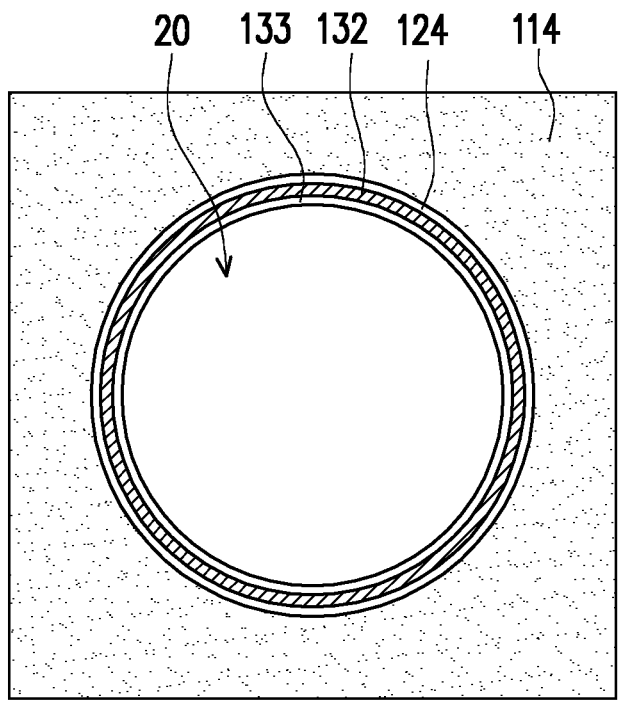

Referring to FIG. 1I and FIG. 2I, a second anisotropic etching process is performed to remove the channel material 132a on the top surface of the stack structure 110 and the bottom surface of the composite opening 20, thereby forming a channel layer 132. Specifically, as shown in FIG. 1I, the channel layer 132 is also formed between the stack structure 110 and the spacer 133, and between the polysilicon layer 108 and the spacer 133 in the manner of the spacer. In one embodiment, the top surface 132t of the channel layer 132 may be coplanar with the top surface 110t of the stack structure 110, and the top surface 132t of the channel layer 132 may be lower than the top surface 133t of the spacer 133. In one embodiment, the said second anisotropic etching process includes a reactive ion etching (RIE) process.

Figure 2J:
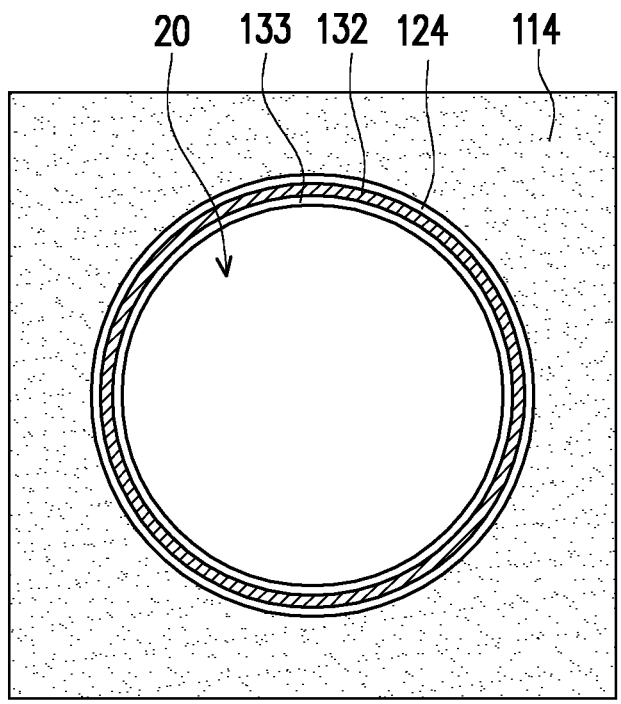

Referring to FIG. 1J and FIG. 2J, by using the spacer 133 as a mask, an over-etching process is performed on the channel layer 132 to adjust a height of the channel layer 132. In one embodiment, the top surface 132t' of the channel layer 132 may be lowered to be lower than the top surface 110t of the stack structure 110. For example, the top surface 132t' of the channel layer 132 may be between a top surface 112t of the topmost dielectric layer 112tm and a top surface 114t of the topmost sacrificial layer 114tm. In the present embodiment, a distance D1 between the top surface 132t' of the channel layer 132 and the top surface 114t of the topmost sacrificial layer 114tm is less than 200 Å. In an embodiment, the distance D1 may be between 30 Å and 200 Å. In alternative embodiments, the distance D1 may be between 100 Å and 200 Å. In some embodiments, the said over-etching process includes using an etching gas with a high etching selectivity to the channel layer 132. In other words, in the said over-etching process, most of the channel layer 132 is removed, but the cap layer 106, the dielectric layers 112, and the spacer 133 are not removed or only a small amount of those are removed.

Figure 2K:
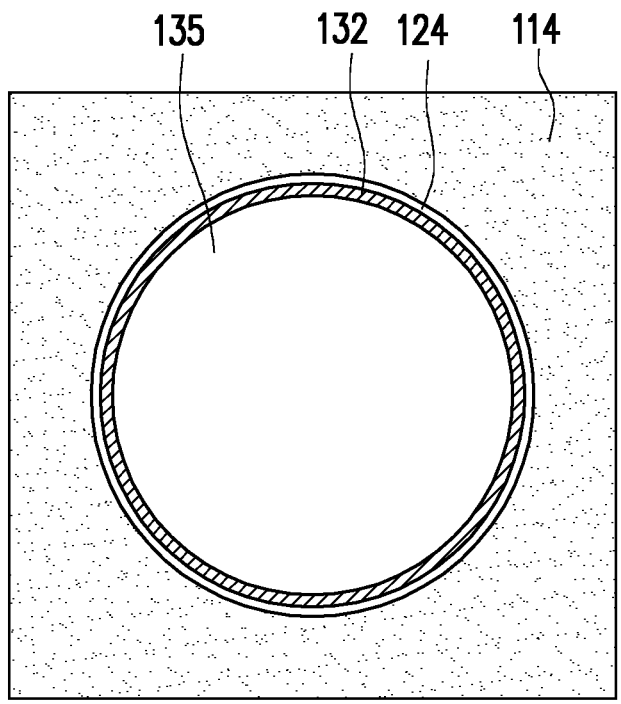
Figure 2L:
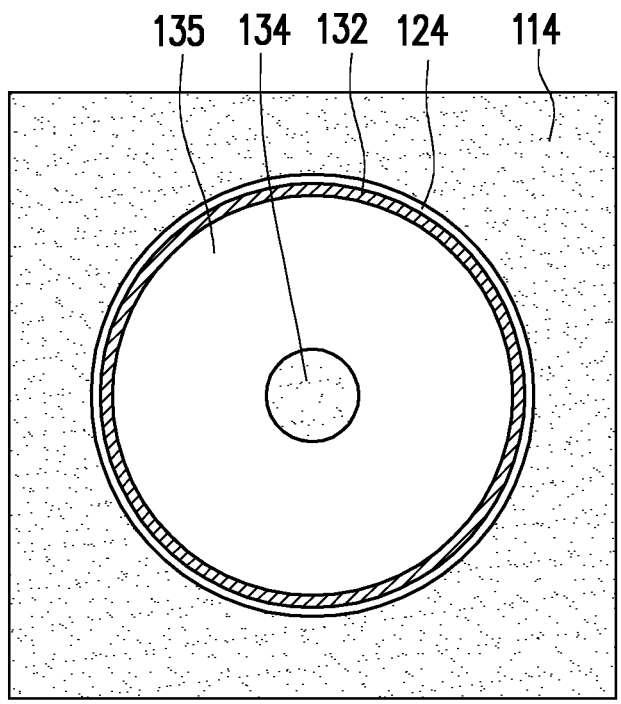

Referring to FIG. 1K and FIG. 2K, after adjusting the height of the channel layer 132, the spacer 133 is removed to expose the channel layer 132. In an embodiment, the method for removing the spacer 133 may include a wet etching method, a dry etching method, or a combination thereof.

Referring to FIG. 1K to FIG. 1L and FIG. 2K to FIG. 2L, a dielectric material 135 is formed in the composite opening 20, and an insulating pillar 134 is formed in the dielectric material 135. Specifically, the dielectric material 135 is formed in the composite opening 20 by a chemical vapor deposition method. It should be noted that the dielectric material 135 does not fully fill up the composite opening 20, but retains a central portion of the composite opening 20. Afterwards, the insulating pillar 134 is formed in the composite opening 20 to fully fill up the central portion of the composite opening 20. In one embodiment, the insulating pillar 134 and the dielectric material 135 may have different dielectric materials. For example, the insulating pillar 134 may be silicon nitride, and the dielectric material 135 may be silicon oxide. In other embodiments, the composite opening 20 may be fully filled up with the dielectric material 135, and then a central opening is formed in the dielectric material 135, and the central opening is fully filled up with the insulating pillar 134. In such embodiment, the insulating pillar 134 may penetrate through the dielectric material 135 and the cap layer 106 to contact the substrate 100 between the polysilicon layers 102 and 104.

Figure 2M:
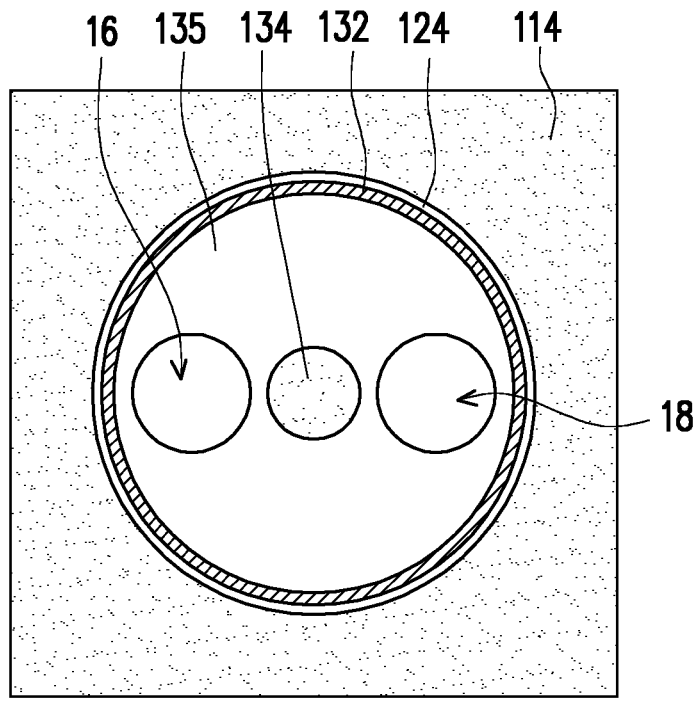

Referring to FIG. 1M and FIG. 2M, two openings 16 and 18 (also referred to as third openings) are formed in the dielectric material 135. Specifically, the opening 16 penetrates through the dielectric material 135 and the cap layer 106 to expose the polysilicon layer 102 in the substrate 100; and the opening 18 penetrates the dielectric material 135 and the cap layer 106 to expose the polysilicon layer 104 in the substrate 100. In this case, the openings 16 and 18 may be regarded as source/drain (S/D) holes. In one embodiment, the openings 16 and 18 have a circular profile from the plan view of FIG. 2M, but the invention is not limited thereto. In other embodiments, the openings 16 and 18 may have profiles of other shapes, such as an ellipse, a rectangle, a polygon, or a combination thereof. In the present embodiment, the openings 16 and 18 are respectively formed on opposite sides of the insulating pillar 134 and do not contact the insulating pillar 134 and the channel layer 132, but the invention is not limited thereto. In other embodiments, the openings 16 and 18 may be in contact with the insulating pillar 134 and/or the channel layer 132. The openings 16 and 18 may be used to define the positions of the source/drain (S/D) of the memory device of the present embodiment. In the present embodiment, the layout for forming the openings 16 and 18 is the same as the layout for forming the polysilicon layers 102 and 104. In other words, the said two processes may be applied to the same photomask to reduce manufacturing costs.

Figure 2N:
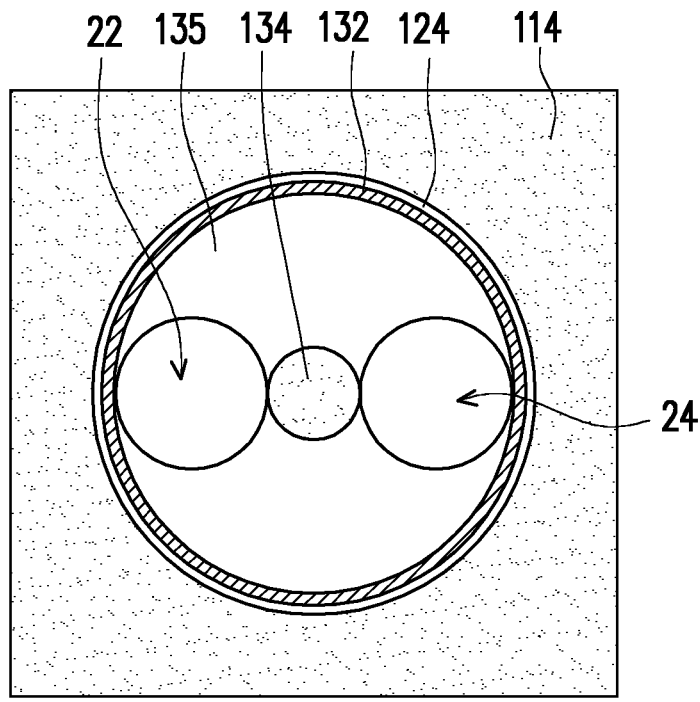

Referring to FIG. 1N and FIG. 2N, the cross-sectional area of the openings 16 and 18 is widened, so that the widened openings 22 and 24 are in contact with the insulating pillar 134 and/or the channel layer 132, respectively. In one embodiment, the method of widening the openings 16 and 18 is performing an isotropic etching process on the openings 16 and 18, for example. In detail, during the isotropic etching process, the dielectric material 135 (e.g., silicon oxide) around the openings 16, 18 is removed by using the insulating pillar 134 (e.g., silicon nitride), the channel layer 132 (e.g., polysilicon), and the polysilicon layers 102 and 104 as etching stop layers. In this case, the widened openings 22 and 24 may be in contact with the insulating pillar 134 and/or the channel layer 132, as shown in FIG. 2N. However, the present invention is not limited thereto. In other embodiments, as shown in FIG. 1N, one side of the widened openings 22 and 24 may be in contact with the channel layer 132, and the other side of the widened openings 22 and 24 may be not in contact with the insulating pillar 134.

Figure 2O:
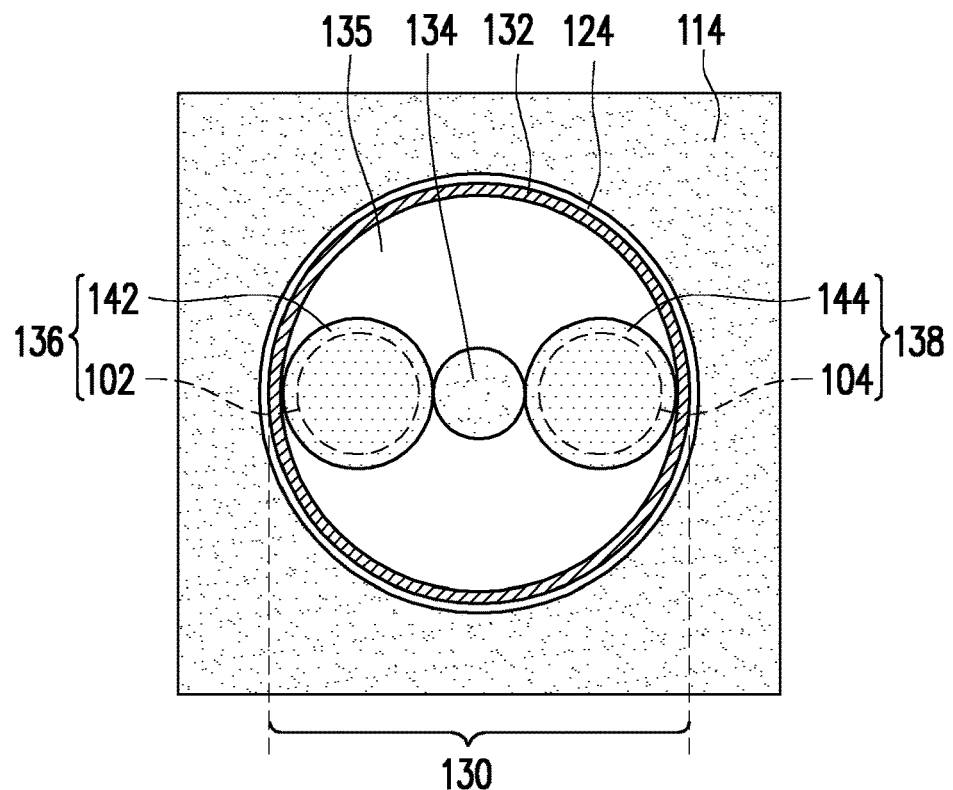

Referring to FIG. 1O and FIG. 2O, the widened openings 22 and 24 are respectively filled with polysilicon materials 142 and 144, so as to contact the polysilicon layers 102 and 104, thereby forming a first source/drain (S/D) pillar 136 and a second S/D pillar 138 of the memory device of the present embodiment. In the present embodiment, the polysilicon materials 142 and 144 and the polysilicon layers 102 and 104 have the same material, such as N-type doped (N+) polysilicon materials. In this case, the first S/D pillar 136 may include the polysilicon layer 102 (also referred to as a first portion) embedded in the substrate 100 and the polysilicon material 142 (also referred to as a second portion) disposed on the polysilicon layer 102. In addition, the second S/D pillar 138 may also include the polysilicon layer 104 embedded in the substrate 100 and the polysilicon material 144 disposed on the polysilicon layer 104. As shown in FIG. 2O, the cross-sectional area of the polysilicon layers 102 and 104 (indicated by dashed lines) is less than the cross-sectional area of the polysilicon materials 142 and 144, and the polysilicon layers 102 and 104 are located within the range of the polysilicon materials 142 and 144. After forming the S/D pillars 136 and 138, the vertical channel structure 130 of the present invention is accomplished. As shown in FIG. 1O, the vertical channel structure 130 penetrates through the stack structure 110, the polysilicon layer 108, and the cap layer 106 to contact the substrate 100. Specifically, the vertical channel structure 130 may include the channel layer 132, the insulating pillar 134, the dielectric material 135, the first S/D pillar 136, and the second S/D pillar 138. The first S/D pillar 136 and the second S/D pillar 138 penetrate through the dielectric material 135 and partially extend into the substrate 100. The insulating pillar 134 is disposed between the first S/D pillar 136 and the second S/D pillar 138 to separate the first S/D pillar 136 from the second S/D pillar 138. In addition, as shown in the plan view of FIG. 2O, the channel layer 132 laterally surrounds the insulating pillar 134, the dielectric material 135, the first S/D pillar 136 and the second S/D pillar 138.

Figure 2P:
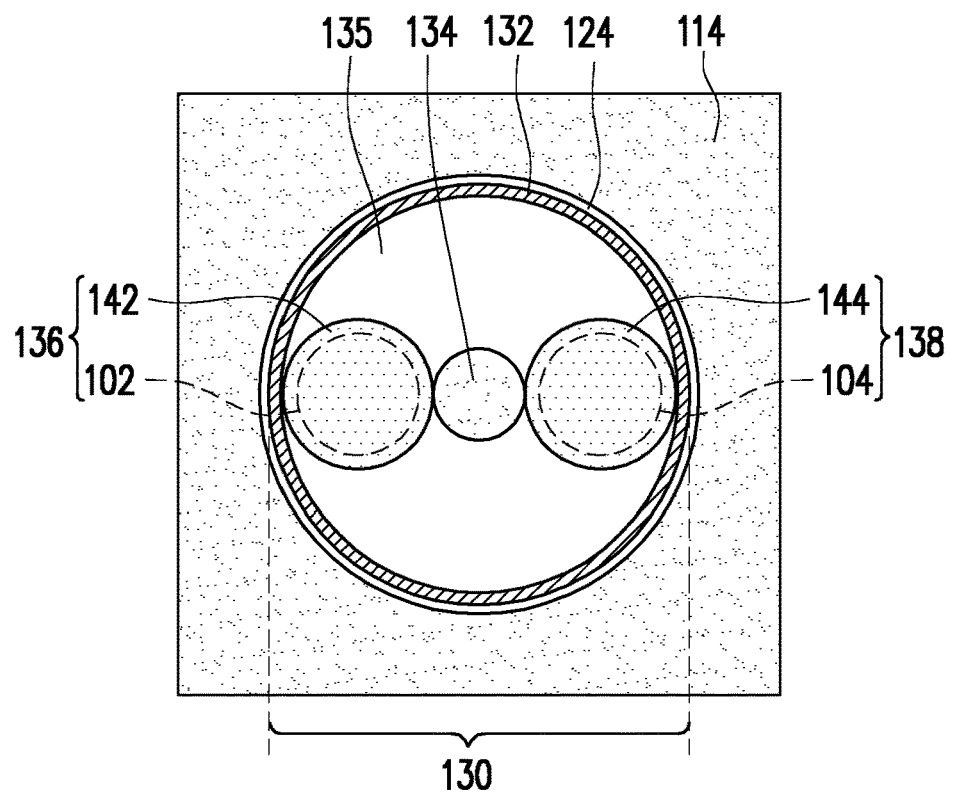

After forming the vertical channel structure 130, a gate replacement process may be performed to replace the sacrificial layers 114 in the stack structure 110 by a plurality of conductive layers 154, as shown in FIG. 1P to FIG. 1R and FIG. 2P to FIG. 2R.

first, referring to FIG. 1P and FIG. 2P, a slit 30 is formed in the stack structure 110 aside the vertical channel structure 130. The slit 30 penetrates through the stack structure 110, the polysilicon layer 108, and the cap layer 106 to expose a portion of the substrate 100. Although a bottom surface of the slit 30 shown in FIG. 1P is lower than the bottom surface of the cap layer 106, the present invention is not limited thereto. In other embodiments, as long as the bottom surface of the slit 30 is equal to or lower than the bottom surface of the bottom sacrificial layer 114*bm*, it is the scope of protection of the present invention.

Figure 2Q:
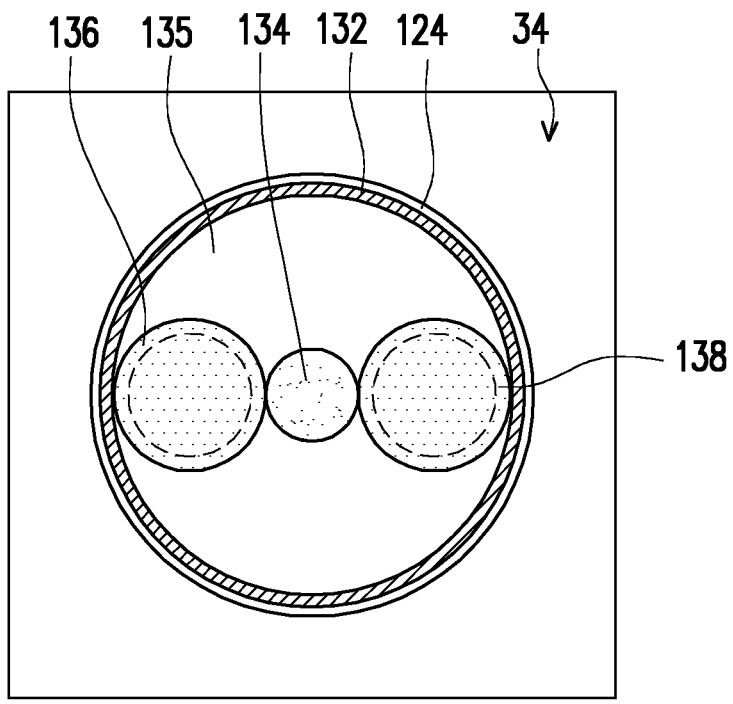
Figure 2R:
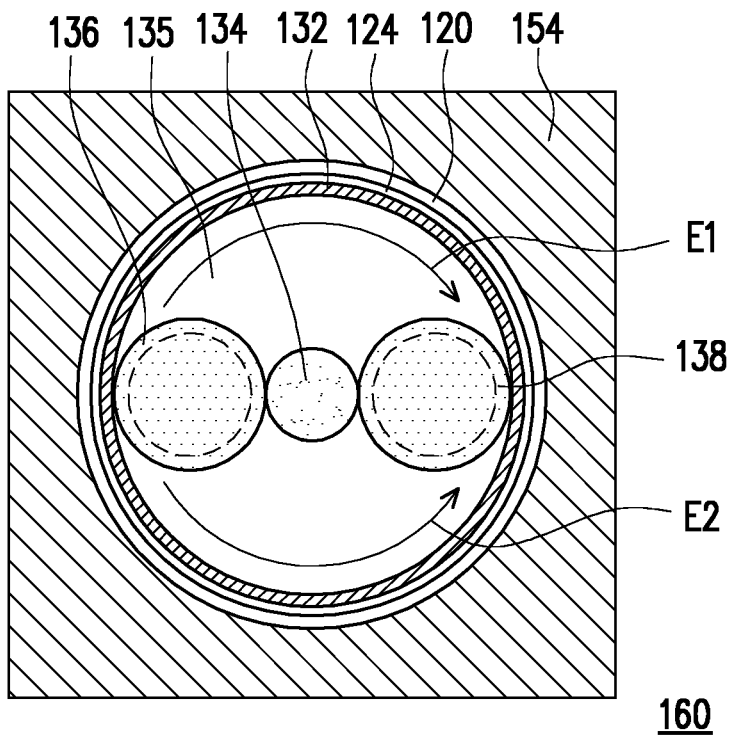

Referring to FIG. 1Q and FIG. 2Q, an etching process is performed to remove the sacrificial layers 114 to form a plurality of gaps 34 between the dielectric layers 112. The gaps 34 laterally expose the oxide layer 124. In other words, the gaps 34 are defined by the dielectric layers 112 and the oxide layer 124. It should be noted that the oxide layer 124 may be regarded as the etching stop layer of the said etching process, so as to avoid over-etching and further damage the channel layer 132. In one embodiment, the etching process may be a wet etching process. For example, when the sacrificial layers 114 are silicon nitride, the etching process may be to use an etching solution containing phosphoric acid and pour the etching solution into the slit 30, thereby removing the sacrificial layers 114. Since the etching solution has a high etching selectivity with respect to the sacrificial layers 114, the sacrificial layers 114 may be completely removed, while the dielectric layers 112, the polysilicon layer 108, and the cap layer 106 are not removed or only a small amount of those are removed.

Referring to FIG. 1R and FIG. 2R, a charge storage layer 120 and the conductive layers 154 are sequentially formed in the gaps 34, thereby accomplishing the memory device 1 of the present invention. Specifically, as shown in FIG. 1R, the charge storage layer 120 conformally covers the gaps 34 to surround the conductive layers 154. In an embodiment, the charge storage layer 120 may be a composite layer of oxide/nitride/oxide (ONO), a composite layer of oxide/nitride/oxide/nitride/oxide (ONONO), a composite layer of silicon/oxide/nitride/oxide/silicon (SONOS), or other suitable materials. In an embodiment, a material of the conductive layers 154 is, for example, polysilicon, amorphous silicon, tungsten (W), cobalt (Co), aluminum (Al), tungsten silicide ($WSi_x$), or cobalt silicide ($CoSi_x$). In addition, after forming the charge storage layer 120 and before forming the conductive layers 154, a buffer layer and a barrier layer may be sequentially formed between the charge storage layer 120 and the conductive layers 154. A material of the buffer layer is made of, for example, a material with a high dielectric constant of a dielectric constant greater than 7, such as aluminum oxide ($Al_2O_3$), hafnium oxide ($HfO_2$), lanthanum oxide ($La_2O_5$), transition metal oxide, lanthanide oxide, or a combination thereof. A material of the barrier layer is made of, for example, titanium (Ti), titanium nitride (TiN), tantalum (Ta), tantalum nitride (TaN), or a combination thereof.

In the present embodiment, the memory device 1 has a plurality of memory cells 160. In detail, as shown in FIG. 1R, in the memory device 1, there are 4 memory cells 160 stacked on each other. However, the present invention is not limited thereto, in other embodiments, the number of the memory cells 160 may be adjusted with the number of the conductive layers 154 in the stack structure 210. In addition, although FIG. 1R and FIG. 2R only illustrate a single vertical channel structure 130, the present invention is not limited thereto. In alternative embodiments, the memory device 1 may include a plurality of vertical channel structures 130, and these vertical channel structures 130 may be arranged as an array in a top view.

In order to operate the memory device 1, after the memory device 1 is manufactured, conductive lines are formed over the memory device 1 to be electrically connected to the memory device 1. In the present embodiment, some conductive lines formed over and electrically connected to the first S/D pillar 136 used as a source are used as source lines, and the other conductive lines formed over and electrically connected to the second S/D pillar 138 as a drain are used as bit lines, and these source and bit lines are arranged parallel to each other without contacting each other.

An operation of the memory cell 160 in the memory device 1 is described below.

For the memory device 1, each memory cell 160 may be operated individually. An operation voltage may be applied to the first S/D pillar 136, the second S/D pillar 138, and a corresponding conductive layer 154 (which may be regarded as gate or word line), to perform a writing (programming) operation, a reading operation, or an erasing operation. When the writing voltage is applied to the first S/D pillar 136 and the second S/D pillar 138, because the first S/D pillar 136 and the second S/D pillar 138 are connected to the channel layer 132, an electron may be transmitted along a first electrical path E1 and a second electrical path E2 (e.g., a double-sided electrical path) and stored in the entire charge storage structure 120.

It should be noted that the memory device 1 also includes a transistor 170 disposed between the stack structure 210 and the substrate 100. In this embodiment, the transistor 170 may be, but is not limited to, a metal-oxide-semiconductor field-effect transistor (MOSFET). Specifically, as shown in FIG. 1R, the transistor 170 may include the polysilicon layer 108 used as a gate electrode, the oxide layer 128 used as a gate dielectric layer, and the first S/D layer 136 used as a source, and the second S/D pillar 138 used as a drain. When a reading operation is performed on the overlying memory cell 160, 0V may be applied to the polysilicon layer 108 or the polysilicon layer 108 is grounded to turn-off the unnecessary parasitic leakage current, thereby improving the performance of the memory device 1.

Figure 4:
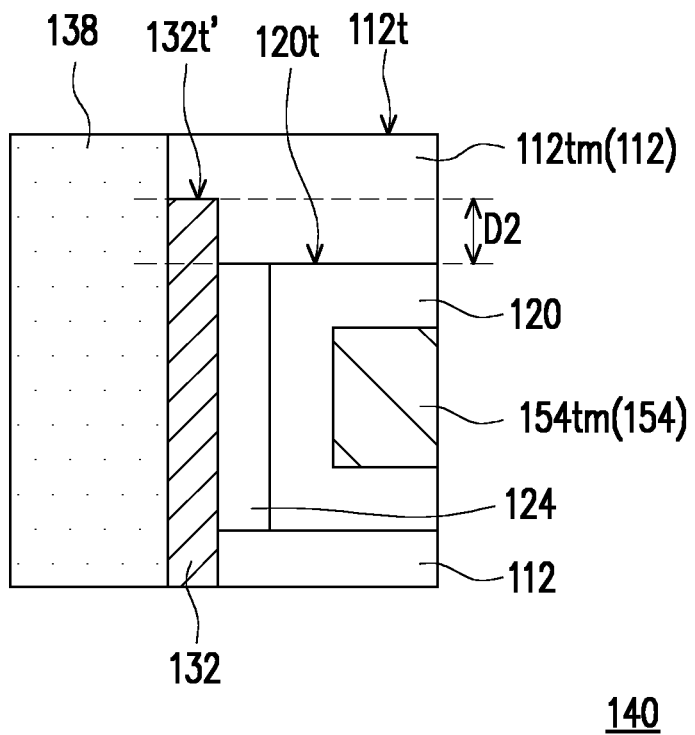
FIG. 4 and FIG. 5 are enlarged views of regions of FIG. 1R, respectively.
Figure 5:
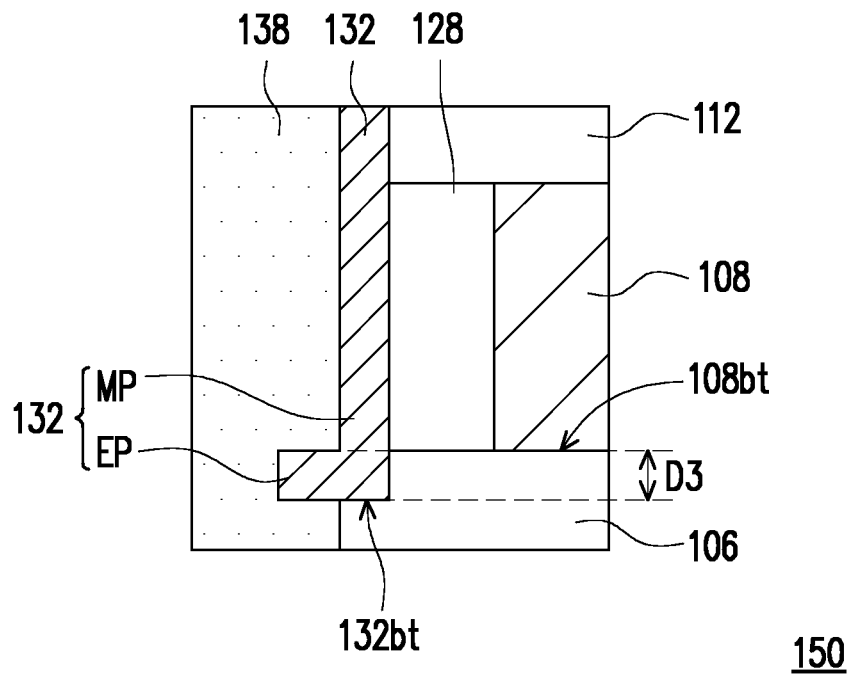

FIG. 4 illustrates an enlarged view of a region 140 of FIG. 1R, and FIG. 5 illustrates an enlarged view of a region 150 of FIG. 1R.

Referring to FIG. 4, a top surface 132t' of the channel layer 132 may be between the top surface 112t of the topmost dielectric layer 112tm and the top surface 120t of the charge storage layer 120. In this embodiment, a distance D2 between the top surface 132t' of the channel layer 132 and the top surface 120t of the charge storage layer 120 is less than 200 Å. In an embodiment, the distance D2 may be between 30 Å and 200 Å. In alternative embodiments, the distance D2 may be between 100 Å and 200 Å. It should be noted that when the distance D2 of the channel layer 132 protruding from the top surface 120t of the charge storage layer 120 is greater than 200 Å, the unnecessary parasitic leakage current will be generated during the operation of the topmost conductive layer 154tm, so as to affect the performance of the memory device 1. Therefore, in the present invention, the distance D2 of the channel layer 132 protruding from the top surface 120t of the charge storage layer 120 is controlled to be less than 200 Å, so as to effectively reduce the unnecessary parasitic leakage current, thereby increasing the operation window of the memory device 1.

Referring to FIG. 5, a bottom surface 132bt of the channel layer 132 may protrude downward from the bottom surface 108bt of the polysilicon layer 108. In this embodiment, a distance D3 between the bottom surface 132bt of the channel layer 132 and the bottom surface 108bt of the polysilicon layer 108 is less than 200 Å. In an embodiment, the distance D3 may be between 30 Å and 200 Å. In alternative embodiments, the distance D3 may be between 100 Å and 200 Å. It should be noted that when the distance D3 of the channel layer 132 protruding from the bottom surface 108bt of the polysilicon layer 108 is greater than 200 Å, the unnecessary parasitic leakage current will be generated during the read operation, so as to affect the performance of the memory device 1. Therefore, in the present invention, the distance D3 of the channel layer 132 protruding from the bottom surface 108bt of the polysilicon layer 108 is controlled to be less than 200 Å, so as to effectively reduce the unnecessary parasitic leakage current, thereby increasing the operation window of the memory device 1.

In an embodiment, as shown in FIG. 5, the channel layer 132 may include a main body portion MP and an extending portion EP. The main body portion MP is disposed between the S/D pillar 138 (or 136) and the stack structure 210, and between the S/D pillar 138 (or 136) and the polysilicon layer 108. The extending portion EP is connected to a bottom surface of the main body portion MP and is laterally extended into the S/D pillar 138 (or 136). In some embodiments, a thickness of the extending portion EP is substantially equal to the distance D3, namely, the thickness of the extending portion EP may be less than 200 Å.

The memory device 1 of the said first embodiment uses an oxide/nitride/oxide (ONO) last process to form the charge storage layer 120. However, the present invention is not limited thereto. A memory device 2 of the second embodiment may also use an ONO first process to form a charge storage layer 220. The detail is shown in the following paragraphs.

Figure 6:
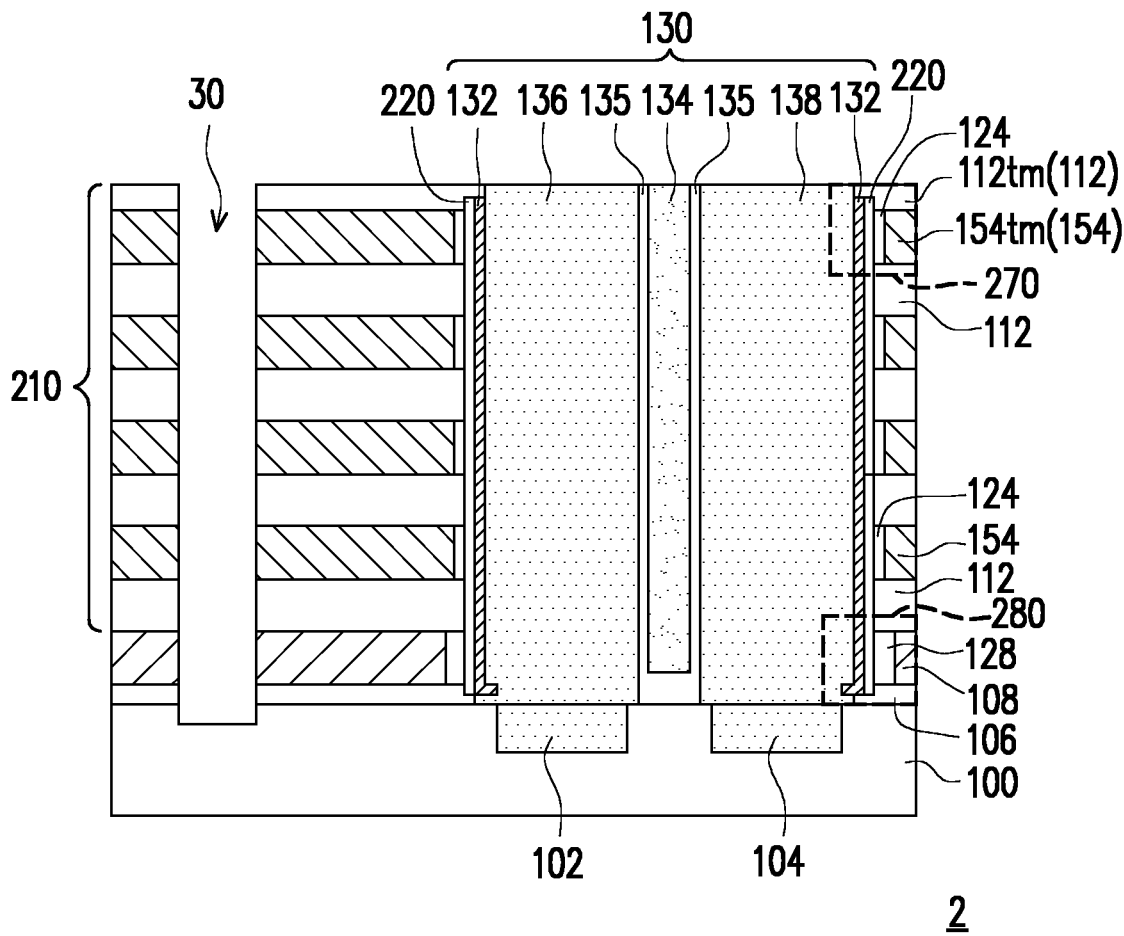
FIG. 6 is a schematic cross-sectional view of a memory device according to a second embodiment of the invention.
Figure 7:
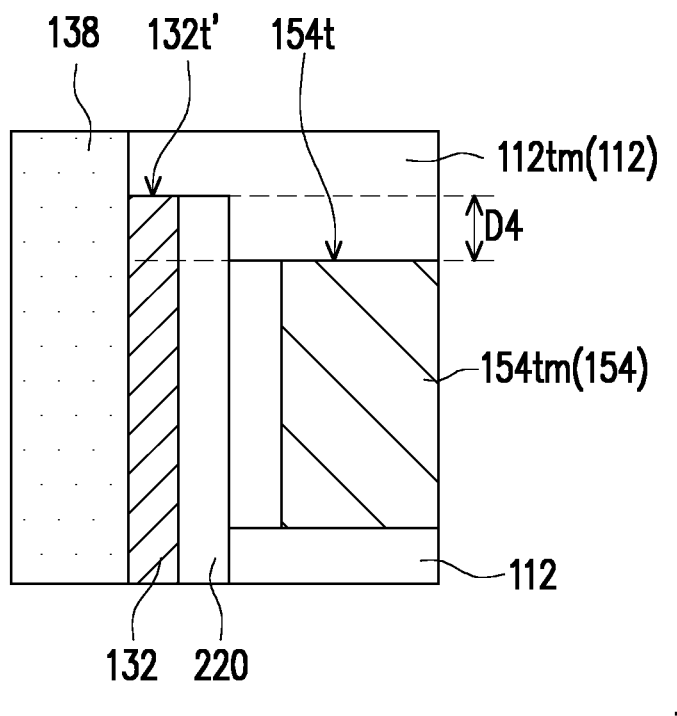
FIG. 7 and FIG. 8 are enlarged views of regions of FIG. 6, respectively.
Figure 8:
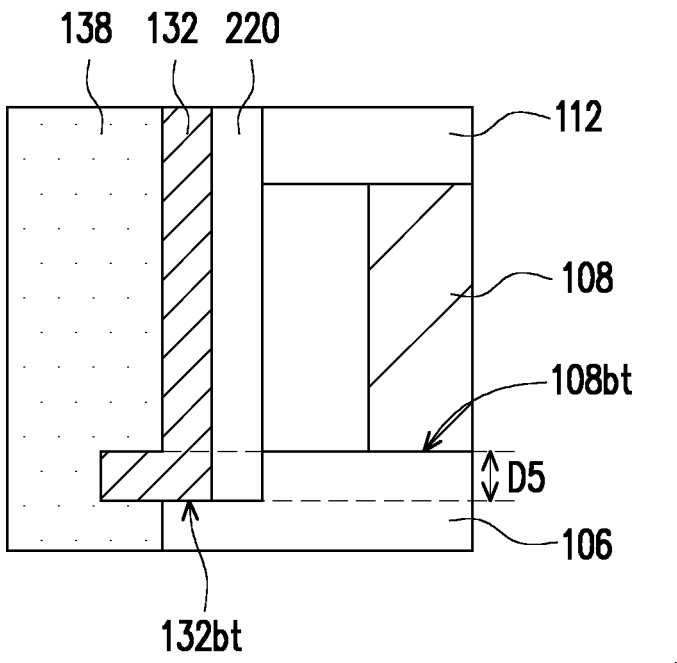

FIG. 6 is a schematic cross-sectional view of a memory device 2 according to a second embodiment of the invention. FIG. 7 illustrates an enlarged view of a region 270 of FIG. 6, and FIG. 8 illustrates an enlarged view of a region 280 of FIG. 6.

Referring to FIG. 6, the memory device 2 of the second embodiment is similar to the memory device 1 of the first embodiment, and the same or similar components are represented by the same or similar reference numbers, which will not be repeated here. The main difference between the memory devices 1 and 2 lies in that the charge storage layer 220 of the memory device 2 is disposed between the channel layer 132 and the stack structure 210. Specifically, the method of forming the charge storage layer 220 may include: before forming the channel material, forming a charge storage material to conformally cover the top surface of the stack structure 110 and the surface of the composite opening 20; and performing an anisotropic etching process to remove the charge storage material on the top surface of the stack structure 110 and the bottom surface of the composite opening 20, thereby forming the charge storage layer 220 on the sidewall of the composite opening 20. In other words, the charge storage layer 220 is formed on the sidewall of the composite opening 20 in the manner of a spacer. After forming the charge storage layer 220, the steps of FIG. 1F to FIG. 1K are continued to form the channel layer 132, and the steps of FIG. 1L to FIG. 1R are continued to form the vertical channel structure 130 and the conductive layers 154. In this case, as shown in FIG. 6, the channel layer 132 and the charge storage layer 220 may continuously extend in a direction perpendicular to the top surface of the substrate 100.

In addition, during the gate replacement process, since the charge storage layer 220 has been formed between the channel layer 132 and the stack structure 110, when the conductive layers 154 are filled in the gaps 34 (as shown in FIG. 1Q) between the dielectric layers 112, the conductive layers 154 may be in direct contact with the adjacent dielectric layers 112 and the corresponding oxide layer 124. In an alternative embodiment where the oxide layer 124 is not be formed, the conductive layers 154 may be in direct contact with the charge storage layer 220.

It should be noted that, as shown in FIG. 7, the channel layer 132 and charge storage layer 220 of the memory device 2 protrude upward from the top surface 154t of the topmost conductive layer 154tm, and a distance D4 between the top surface 132t' of the channel layer 132 and the top surface 154t of the topmost conductive layer 154tm is less than 200 Å. In an embodiment, the distance D4 may be between 30 Å and 200 Å. In alternative embodiments, the distance D4 may be between 100 Å and 200 Å. It is worth noted that when the distance D4 of the channel layer 132 protruding from the top surface 154t of the top conductive layers 154tm is greater than 200 Å, the unnecessary parasitic leakage current will be generated during the operation of the topmost conductive layer 154tm, so as to affect the memory device 2. Therefore, in the present invention, the distance D4 of the channel layer 132 protruding from the top surface 154t of the topmost conductive layer 154tm is controlled to be less than 200 Å to effectively reduce the unnecessary parasitic leakage current, thereby increasing the operation window of the memory device 2.

In addition, referring to FIG. 8, the channel layer 132 and the charge storage layer 220 protrude downward from the bottom surface 108bt of the polysilicon layer 108, and a distance D5 between the bottom surface 132bt of the channel layer 132 and the bottom surface 108bt of the polysilicon layer 108 is less than 200 Å. In an embodiment, the distance D5 may be between 30 Å and 200 Å. In alternative embodiments, the distance D5 may be between 100 Å and 200 Å. It should be noted that when the distance D5 of the channel layer 132 protruding from the bottom surface 108bt of the polysilicon layer 108 is greater than 200 Å, the unnecessary parasitic leakage current will be generated during the read operation, so as to affect the performance of the memory device 2. Therefore, in the present invention, the distance D5 of the channel layer 132 protruding from the bottom surface 108bt of the polysilicon layer 108 is controlled to be less than 200 Å, so as to effectively reduce the unnecessary parasitic leakage current, thereby increasing the operation window of the memory device 2.

In summary, in the present embodiment, the P-type polysilicon layer is formed between the substrate and the stacked structure, so that the P-type polysilicon layer is used as an etching stop layer for subsequent vertical channel holes, thereby avoiding over-etching. In addition, in the present embodiment, two N-type polysilicon layers are formed in the substrate, so that the two N-type polysilicon layers are used as etching stop layers for subsequent source/drain openings, thereby avoiding over-etching.

Further, in the present embodiment, the channel layer protrudes upward from the top surface of the charge storage layer by a distance of less than 200 Å, and the channel layer protrudes downward from the bottom surface of the P-type polysilicon layer by a distance of less than 200 Å, so as to effectively reduce unnecessary parasitic leakage current, thereby increasing the operation window of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a substrate;
   a stack structure, disposed on the substrate, wherein the stack structure comprises a plurality of dielectric layers and a plurality of conductive layers stacked alternately;
   a polysilicon layer, disposed between the substrate and the stack structure;
   a vertical channel structure, penetrating through the stack structure and the polysilicon layer; and
   a charge storage structure, at least disposed between the vertical channel structure and the plurality of conductive layers,
   wherein the vertical channel structure comprises:
      two source/drain (S/D) pillars, penetrating through the stack structure and the polysilicon layer, and partially extending into the substrate;
      an insulating pillar, disposed between the two S/D pillars to separate the two S/D pillars; and
      a channel layer, surrounding the two S/D pillars,
   wherein the insulating pillar is directly contacted with the two S/D pillars and separated from the channel layer by a dielectric material, and
   wherein each of the two S/D pillars comprises a first portion embedded in the substrate and a second portion disposed on the first portion.

2. The memory device according to claim 1, wherein the polysilicon layer comprises a doped polysilicon material, and the doped polysilicon material is a P-type doped polysilicon material.

3. The memory device according to claim 1, wherein a cross-sectional area of the first portion is less than a cross-sectional area of the second portion, the first and second portions have a same doped polysilicon material, and the doped polysilicon material is a N-type doped polysilicon material.

4. The memory device according to claim 1, wherein the channel layer protrudes downward from a bottom surface of the polysilicon layer, and a distance between a bottom surface of the channel layer and the bottom surface of the polysilicon layer is less than 200 Å.

5. The memory device according to claim 1, wherein the charge storage structure surrounds each conductive layer in the stack structure, the channel layer protrudes upward from a top surface of a topmost conductive layer, and a distance between a top surface of the channel layer and a top surface of a corresponding charge storage structure surrounding the topmost conductive layer is less than 200 Å.

6. The memory device according to claim 1, wherein the charge storage structure continuously extends between the channel layer and the stack structure, the channel layer protrudes upward from a top surface of a topmost conductive layer, and a distance between a top surface of the channel layer and a top surface of the topmost conductive layer is less than 200 Å.

7. The memory device according to claim 1, wherein the channel layer comprises:
a main body portion, disposed between the two S/D pillars and the stack structure, and disposed between the two S/D pillars and the polysilicon layer; and
an extending portion, connecting a bottom surface of the main body portion, and partially extending into the two S/D pillars.

8. The memory device according to claim 1, further comprising a gate dielectric layer disposed between the polysilicon layer and the channel layer.

9. The memory device according to claim 1, wherein the plurality of conductive layers of the stack structure and the polysilicon layer have different materials.

10. The memory device according to claim 1, wherein the insulating pillar and the dielectric material comprise different materials.

11. A method of manufacturing a memory device, comprising:
forming an etching stop layer on a substrate;
forming a stack structure on the etching stop layer, wherein the stack structure comprises a plurality of dielectric layers and a plurality of conductive layers stacked alternately; and
forming a vertical channel structure penetrating through the stack structure and the etching stop layer,
wherein the vertical channel structure comprises:
two source/drain (S/D) pillars, penetrating through the stack structure and the etching stop layer, and partially extending into the substrate;
an insulating pillar, disposed between the two S/D pillars to separate the two S/D pillars; and
a channel layer, surrounding the two S/D pillars,
wherein the insulating pillar is directly contacted with the two S/D pillars and separated from the channel layer by a dielectric material, and
wherein each of the two S/D pillars comprises a first portion embedded in the substrate and a second portion disposed on the first portion.

12. The method of manufacturing the memory device according to claim 11, wherein the etching stop layer comprises a doped polysilicon material, and the doped polysilicon material is a P-type doped polysilicon material.

13. The method of manufacturing the memory device according to claim 11, wherein before forming the etching stop layer on the substrate, the method further comprises forming two polysilicon layers in the substrate.

14. The method of manufacturing the memory device according to claim 13, wherein a cross-sectional area of the first portion is less than a cross-sectional area of the second portion, the first and second portions have a same doped polysilicon material, and the doped polysilicon material is a N-type doped polysilicon material.

15. The method of manufacturing the memory device according to claim 13, wherein the channel layer protrudes upward from a top surface of a topmost conductive layer, and a distance between the top surface of the channel layer and the top surface of the topmost conductive layer is less than 200 Å.

16. The method of manufacturing the memory device according to claim 13, wherein the channel layer protrudes downward from a bottom surface of the etching stop layer, and a distance between a bottom surface of the channel layer and the bottom surface of the etching stop layer is less than 200 Å.

17. The method of manufacturing the memory device according to claim 13, wherein the plurality of conductive layers of the stack structure and the etching stop layer have different materials.

18. The method of manufacturing the memory device according to claim 13, further comprising forming a charge storage layer between the stack structure and the channel layer.

19. The method of manufacturing the memory device according to claim 11, wherein before the forming the plurality of conductive layers, the method further comprises forming a charge storage layer to surround the plurality of conductive layers.

20. The method of manufacturing the memory device according to claim 11, wherein the insulating pillar and the dielectric material comprise different materials.

* * * * *